United States Patent [19]

Hatsuda

[11] Patent Number: 5,559,456
[45] Date of Patent: Sep. 24, 1996

[54] SENSING CIRCUIT UNIT FOR A DYNAMIC CIRCUIT

[75] Inventor: Tsuguyasu Hatsuda, Osaka, Japan

[73] Assignee: Matsushita Electric Industrial Co., Ltd., Osaka, Japan

[21] Appl. No.: 106,551

[22] Filed: Aug. 16, 1993

[30] Foreign Application Priority Data

Aug. 17, 1992 [JP] Japan .................................. 4-217768
Apr. 9, 1993 [JP] Japan .................................. 5-083100

[51] Int. Cl.⁶ ...................................................... H03F 3/45
[52] U.S. Cl. ............................ 327/53; 327/56; 365/205; 365/207; 365/203
[58] Field of Search ........................... 307/530; 365/205, 365/207, 196, 203, 204; 327/51, 53, 54, 55, 56, 57, 219, 77

[56] References Cited

U.S. PATENT DOCUMENTS

| | | | |
|---|---|---|---|
| Re. 34,060 | 9/1992 | Tanimura et al. | 365/207 |
| 4,367,540 | 1/1983 | Shimohigashi | 365/207 |
| 4,763,026 | 8/1988 | Tsen et al. | 365/207 |
| 4,932,002 | 6/1990 | Honston | 365/207 |
| 5,206,552 | 4/1993 | Iwashita | 365/205 |
| 5,260,899 | 11/1993 | Yasuda et al. | 365/207 |
| 5,325,335 | 6/1994 | Ang et al. | 365/205 |

FOREIGN PATENT DOCUMENTS 4-238197  8/1992  Japan .

Primary Examiner—Timothy P. Callahan
Assistant Examiner—My-Trang Nu Ton
Attorney, Agent, or Firm—McDermott, Will & Emery

[57] ABSTRACT

In the present invention, there are disposed (i) a P-channel MOSFET for detecting variations of the voltage level of a data line to supply an electric current, and (ii) a current mirror circuit to which an electric current from the P-channel MOSFET is entered as a reference current and of which output current terminal is connected to the data line. When the data line is lowered in voltage level so that an electric current flows from the P-channel MOSFET to the current mirror circuit, an output current of the current mirror circuit flows to the drain of an N-channel MOSFET, so that the data line is electrically discharged. Thus, there is achieved a sensing circuit unit which is suitably used for a dynamic circuit and which can detect, at a high speed, variations of the voltage level of the data line as precharged.

21 Claims, 15 Drawing Sheets

SENSING CIRCUIT UNIT FOR A DYNAMIC CIRCUIT

BACKGROUND OF THE INVENTION

1. Field of the Art

The present invention relates to a sensing circuit unit for a dynamic circuit.

2. Background of the Art

Conventionally, there has been used a dynamic circuit as an arrangement of a large-scale circuit required to be operated at a high speed such as a register file, a RAM, a ROM, a PLA or the like. Such a dynamic circuit has a data line to be precharged to a predetermined voltage level, and uses a sensing circuit unit for detecting the voltage level of the data line.

A conventional sensing circuit unit for a register file reading circuit serving as a dynamic circuit will be discussed with reference to FIG. 14.

FIG. 14 shows a circuit diagram illustrating a conventional sensing circuit unit for a dynamic circuit.

In FIG. 14, a memory cell 701 in a register file comprises N-channel MOSFETs 701a, 701b and a latch circuit 701c. A precharge circuit 702 comprises a P-channel MOSFET. There is also an inverter circuit 703.

In the conventional sensing circuit unit for a dynamic circuit having the arrangement above-mentioned, when a precharge enable line 712 of the precharge circuit 702 is controlled so that the voltage level of a bit line 711 is precharged to a high voltage level (hereinafter referred to as "H") and a word line 713 of the memory cell 701 is set to "H", the voltage level of the bit line 711 is determined based on the contents of the memory cell 701.

When the contents of the memory cell 701 are "H", the bit line 711 is electrically discharged so that the voltage level of the bit line 711 is set to a low voltage level (hereinafter referred to as "L"). When the contents of the memory cell 701 are "L", the bit line 711 is not electrically discharged and no electric current flows therein. Accordingly, the bit line 711 remains "H". By the inverter circuit 703, a signal having a logic inverse to that of the voltage level of the bit line 711 is supplied to a sensing output line 714, so that the contents of the memory cell 701 are supplied.

In the conventional sensing circuit unit for a dynamic circuit having the arrangement above-mentioned, at the data reading time, the bit line 711 is electrically discharged only with the use of the MOSFETs 701a, 701b in the memory cell 701. Generally, to reduce a memory cell in area, the memory cell 701 uses the MOSFETs 701a, 701b of which gate widths are small. Further, these two MOSFETs are connected in series to each other. Accordingly, the electric discharge of the bit line 711 takes a long time. Particularly, in the application of a microprocessor or the like, each of the circuits is made in a large size, thus causing a data line such as the bit line 711 or the like to be lengthened. Further, a plurality of cells are connected to increase the wire resistance and load capacitance of the data line, causing the discharge time to be further increased.

As a result, the delay time between the time when the word line 713 is set to "H" and the time when the logic level of the sensing output line 714 is determined is increased. This disadvantageously increases the sensing time of the inverter circuit 703.

SUMMARY OF THE INVENTION

To solve the problems above-mentioned, the present invention has the object of providing a sensing circuit unit suitable for a dynamic circuit and capable of detecting, at a high speed, variations of the voltage level of a precharged data line.

To achieve the object above-mentioned, the present invention provides a first sensing circuit unit for a dynamic circuit for detecting variations of the voltage level of a data line which is disposed in the dynamic circuit and which is precharged to a predetermined voltage level, and this first sensing circuit unit comprises: electric current supply means for supplying an electric current according to variations of the voltage level of the data line; and data line discharging means having an output current terminal connected to the data line for electrically discharging the data line according to the presence or absence of an electric current supplied from said electric current supply means.

By placing limitations on the first sensing circuit unit, the present invention provides a second sensing circuit unit for a dynamic circuit in which: the data line is divided into a first data line to be precharged to a predetermined voltage level in a precharging period of time, and a second data line to be simultaneously precharged to a predetermined voltage level in the precharging period of time above-mentioned; the electric current supply means is adapted to supply an electric current according to variations of the voltage level of the first data line in an evaluating period of time after the precharging period of time above-mentioned; and the data line discharging means is adapted to electrically discharge the second data line according to the presence or absence of an electric current supplied from the electric current supply means.

The present invention provides a third sensing circuit unit for a dynamic circuit comprising, in addition to the component elements in the first or second sensing circuit unit above-mentioned, a supplied electric current control means for controlling, based on the voltage level of the data line or the first or second data line in the first or second sensing circuit unit, the amount of an electric current supplied from the electric current supply means to the data line discharging means.

The present invention provides a fourth sensing circuit unit for a dynamic circuit in which: the data line discharging means in the first or second sensing circuit unit above-mentioned, has an input line to which an electric current from the electric current supply means is entered; and there is further disposed a voltage level setting means adapted such that, when the data line or the first data line is precharged, the voltage level of the input line of the data line discharging means is set to the voltage level of a ground line.

According to the first sensing circuit unit for a dynamic circuit of the present invention, when the data line is precharged in the precharging period of time and the electric discharge of the data line is then started, for example, through at least one MOSFET in a memory cell, the electric current supply means supplies an electric current according to variations of the voltage level of the data line, and the data line discharging means electrically discharges the data line according to such a supply of electric current. Accordingly, the data line is electrically discharged by both the MOSFET of the memory cell and the data line discharging means. This shortens a sensing period of time. Thus, a sensing circuit unit for a dynamic circuit capable of detecting, at a high speed, variations of the voltage level of a precharged data line is achieved.

The second sensing circuit unit for a dynamic circuit of the present invention produces effects similar to those produced by the first sensing circuit unit. Further, since the data line is divided into the first and second data lines, the capacitance of an evaluating circuit connected to the first data line can be reduced even though the capacitance of a load connected to the second data line is great.

According to the third sensing circuit unit for a dynamic circuit of the present invention, after the voltage level of the data line, or the voltage level of the first or second data line, has been determined, the supplied electric current control means can intercept an electric current from the electric current supply means to the data line discharging means, thus preventing a direct current from wastefully flowing in the data line discharging means. This lowers the electric power to be consumed in the sensing circuit unit.

According to the fourth sensing circuit unit for a dynamic circuit of the present invention, when the sequence is returned to a precharging period of time and the data line or the second data line is to be precharged after the electric discharge of the data line or the second data line has been finished, the voltage level of the input line of the data line discharging means is forcibly set to the voltage level of the ground line by the voltage level setting means, even though the data line discharging means is continuously operated so that the voltage level of the data line or the second data line is not returned to the initial voltage level. Accordingly, at the time of such precharging, the operation of the data line discharging means is stopped to electrically disconnect the data line discharging means from the data line or the second data line. This not only stabilizes the voltage level of the data line or the second data line, but also enables the data line or the second data line to be precharged in a short period of time.

The object and novel features of the present invention will be more fully apparent by reading the following detailed description of the present invention with reference to the attached drawings.

BRIEF DESCRIPTION OF THE DRAWINGS

The attached drawings show preferred embodiments of the present invention, wherein.

DETAILED DESCRIPTION OF THE INVENTION

The following description will discuss preferred embodiments of the present invention with reference to the attached drawings.

Figure 1:
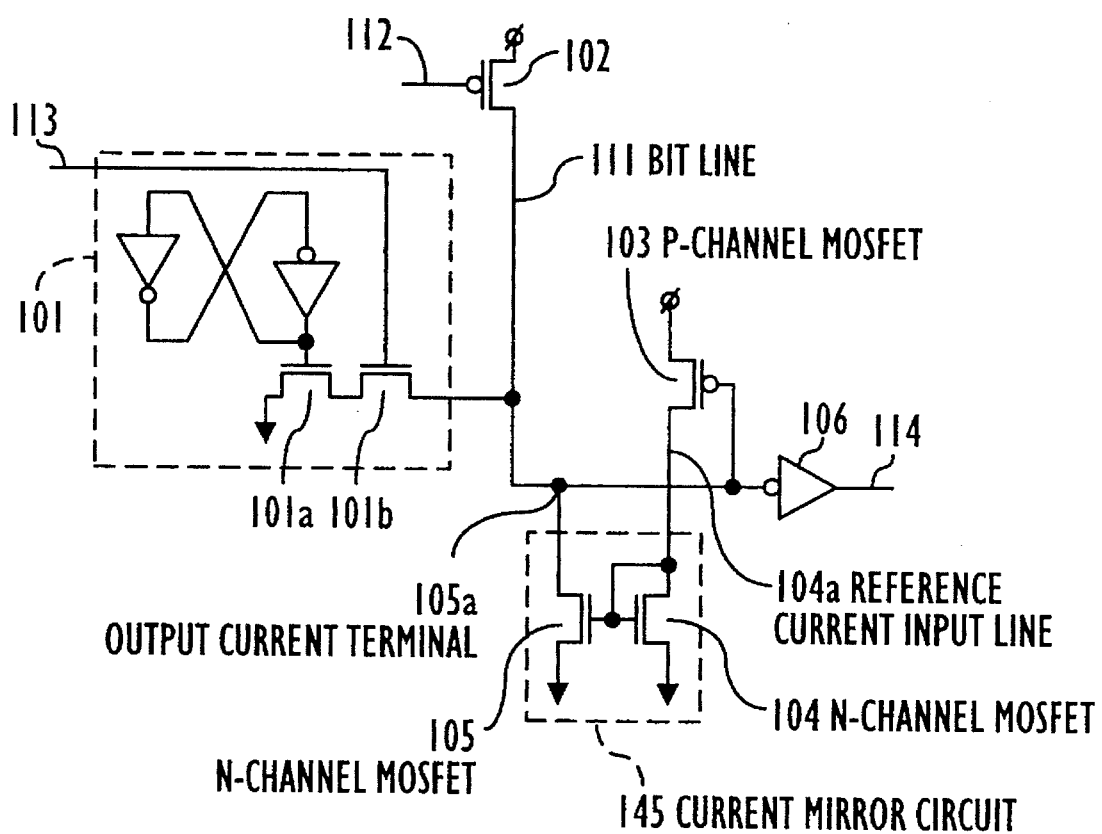
FIG. 1 shows a circuit diagram of the arrangement of main portions of a sensing circuit unit for a dynamic circuit according to a first embodiment of the present invention.

FIG. 1 is a circuit diagram illustrating the arrangement of main portions of a sensing circuit unit for a dynamic circuit according to a first embodiment of the present invention. FIG. 1 shows the sensing circuit unit for a register file reading circuit.

FIG. 1 shows a memory cell 101 in a register file, and a precharge circuit 102 comprising a P-channel MOSFET. The precharge circuit 102 is adapted such that a precharge enable line 112 is controlled to precharge the voltage level of a bit line 111 to "H".

A P-channel MOSFET 103 serves as electric current supply means. When the voltage level VB of the bit line 111 connected to the gate of the P-channel MOSFET 103 is not greater than (VDD–Vtp) wherein VDD is the voltage level of a power supply and Vtp is a threshold voltage of the P-channel MOSFET 103, a drain current flows in the P-channel MOSFET 103, thus detecting the voltage level of the bit line 111.

N-channel MOSFETs 104, 105 form a current mirror circuit 145 serving as a data line discharging circuit. The N-channel MOSFET 104 is arranged such that the gate and drain thereof are connected to the drain of the P-channel MOSFET 103, and the source thereof is grounded. The N-channel MOSFET 105 is arranged such that the gate thereof is connected to the drain of the P-channel MOSFET 103, the drain thereof is connected to the bit line 111 and the source thereof is grounded. In this embodiment, an inverter circuit 106 is disposed for driving an output load of the sensing circuit unit, and an output line of the inverter circuit 106 serves as a sensing output line 114.

Figure 2:
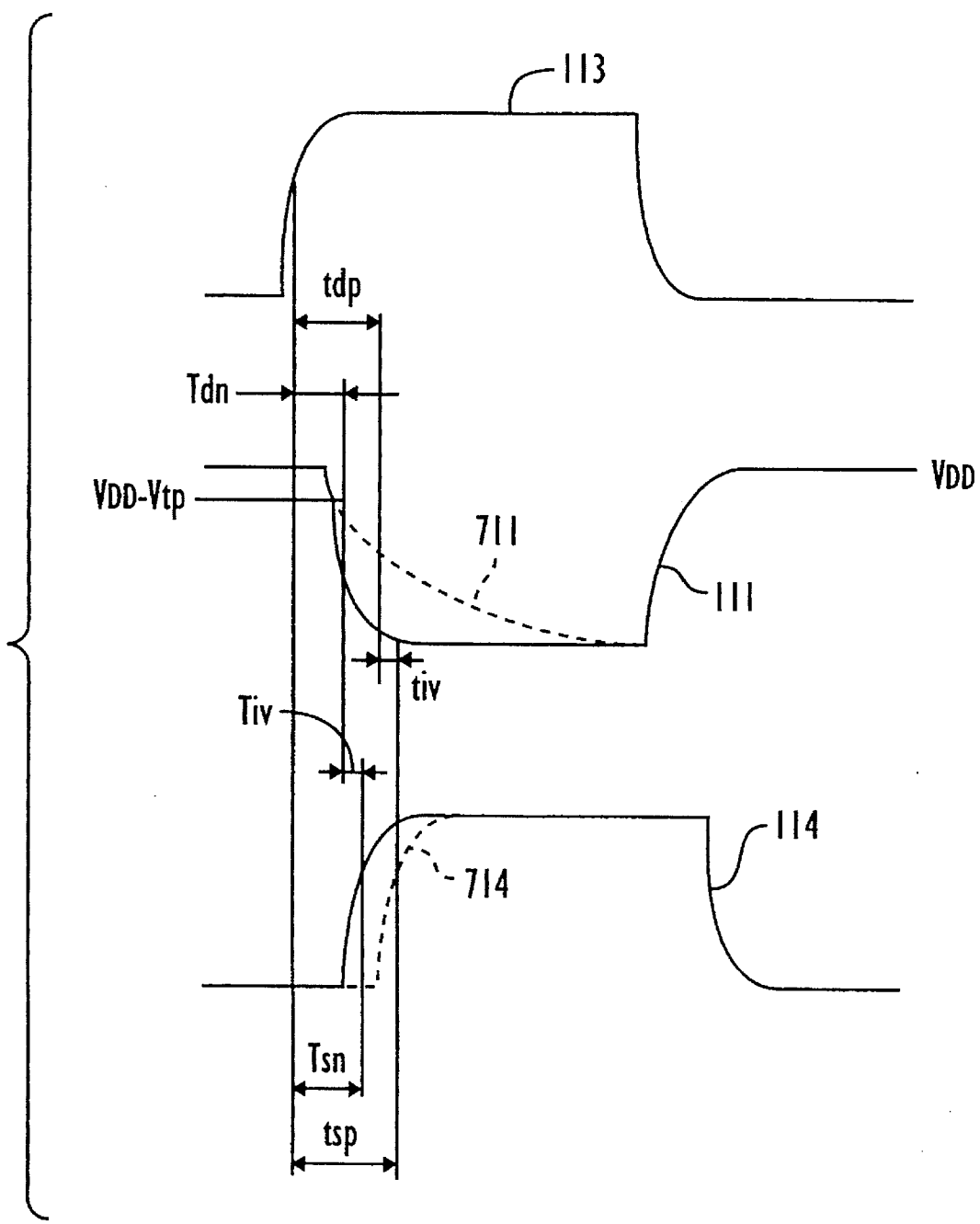
FIG. 2 shows a timing chart illustrating the operation of the sensing circuit unit according to the first embodiment of the present invention.
Figure 14:
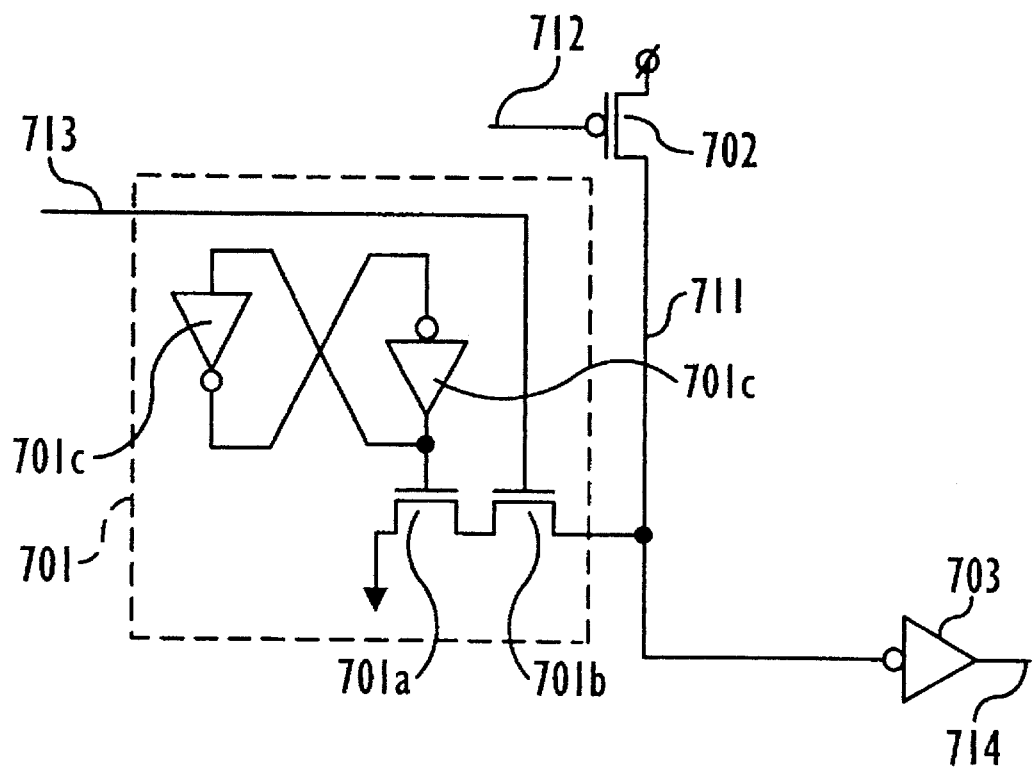
FIG. 14 shows a circuit diagram of a conventional sensing circuit unit for a dynamic circuit.

The operation of the sensing circuit unit comprising the inverter circuit 106, the P-channel MOSFET 103 and the current mirror circuit 145, will be discussed in the following with reference to FIG. 2 showing a diagram of operational timing. In FIG. 2, the voltage level waveforms of respective signal lines in the sensing circuit unit shown in FIG. 1, are designated by the same reference numerals used for designating the respective signal lines. For comparison, the voltage level waveforms of respective signal lines in the conventional sensing circuit unit shown in FIG. 14, are also shown by broken lines and are designated by the same reference numerals used for designating the respective signal lines.

First, the voltage level VB of the bit line 111 is not greater than VDD and is not smaller than (VDD−Vtp), the sensing circuit unit is operated in the following manner.

When a word line 113 is changed in state to "H" as shown in FIG. 2, the voltage level of the bit line 111 is determined based on the contents of the memory cell 101. Assuming that the contents of the memory cell 101 are "H", the voltage level of the bit line 111 starts being dropped to "L". When the contents of the memory cell 101 are "L", the voltage level of the bit line 111 remains unchanged as the precharged voltage level.

Then, when the voltage level VB of the bit line 111 is not greater than (VDD−Vtp) and is not smaller than VSS wherein VSS is the voltage level of a ground line, the sensing circuit unit is operated in the following manner.

When the voltage level VB of the bit line 111 becomes equal to or smaller than (VDD−Vtp), the P-channel MOSFET 103 is turned on and a drain current flows in the P-channel MOSFET 103. This drain current serves as a reference current to be supplied into the current mirror circuit 145. An output current induced by this reference current flows in the drain of the N-channel MOSFET. The drain of the N-channel MOSFET 105 serving as an output current terminal 105a is connected to the bit line 111. Accordingly, the bit line 111 is electrically discharged also by an output current of the current mirror circuit 145.

Accordingly, after the passage of a delay time Tdn from the time when the word line 113 has become "H", the voltage level VB of the bit line 111 is changed to a logic threshold voltage of the inverter circuit 106, and further after the passage of a delay time Tiv of the inverter circuit 106, the voltage level of the sensing output line 114 is determined. Thus, a sensing time Tsn of the sensing circuit unit shown in FIG. 1 is equal to the total time of the delay time Tdn and the delay, time Tiv.

On the other hand, in the conventional sensing circuit unit shown in FIG. 14, the bit line 711 is electrically discharged only by the MOSFETs 701a, 701b in the memory cell 701. This lengthens the discharging time as shown by the broken line in FIG. 2. After the passage of a delay time tdp (which is longer than the delay time Tdn) from the time when the word line 713 has become "H", the voltage level of the bit line 711 is changed to a logic threshold voltage of the inverter circuit 703, and further after the passage of a delay time tiv of the inverter circuit 703, the voltage level of the sensing output line 714 is determined. Accordingly, a sensing time tsp of the conventional sensing circuit unit shown in FIG. 14 is equal to the total time of the delay time tdp and the delay time tiv, and is longer than the sensing time Tsn of the sensing circuit unit shown in FIG. 1.

According to the first embodiment having the arrangement above-mentioned, the bit line 111 in the dynamic circuit is electrically discharged not only by N-channel MOSFETs 101a, 101b in the memory cell 101, but also by an output current flowing in the current mirror circuit 145 (which is the drain current of the N-channel MOSFET 105). This shortens the sensing time.

In the first embodiment, N-channel MOSFETs 104, 105 for forming the current mirror circuit 145 are used, but similar effects may also be produced with the use of P-channel MOSFETs.

Figure 3A:
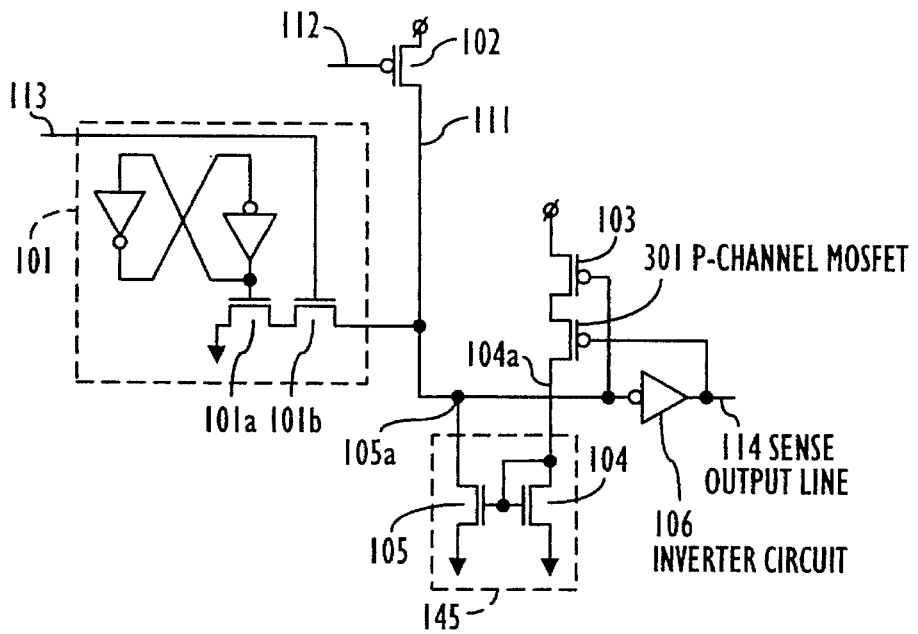
FIGS. 3(a) and (b) show circuit diagrams of the arrangements of main portions of examples of a sensing circuit unit for a dynamic circuit according to a second embodiment of the present invention.
Figure 3B:
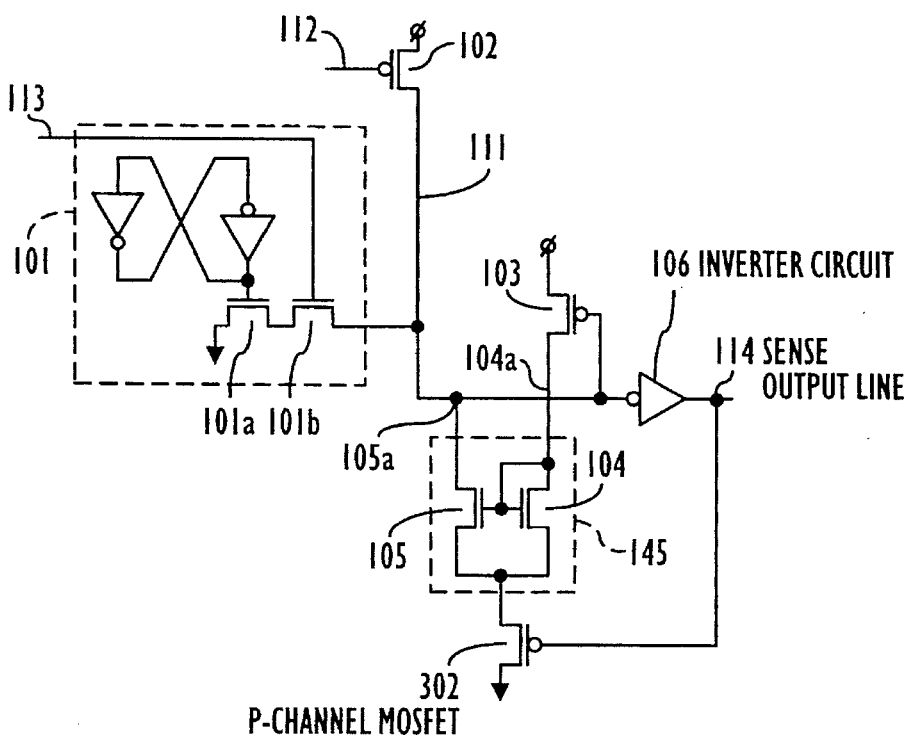

FIGS. 3(a) and 3(b) show circuit diagrams of the arrangements of main portions of examples of a sensing circuit unit for a dynamic circuit according to a second embodiment of the present invention. In FIG. 3, like parts are designated by like reference numerals used in FIG. 1.

In FIG. 3 (a) and (b), each of P-channel MOSFETs 301, 302 serves as a supplied electric current control means for controlling, based on the voltage level of a sensing output line 114, the amount of an electric current supplied from a P-channel MOSFET 103 serving as electric current supply means, to a current mirror circuit 145 serving as data line discharging means.

In an example of the sensing circuit unit shown in FIG. 3 (a), the P-channel MOSFET 301 is arranged such that the gate thereof is connected to the sensing output line 114, the source thereof is connected to the drain of the P-channel MOSFET 103 and the drain thereof is connected to a reference current input line 104a.

In the sensing circuit unit having the arrangement above-mentioned, when a bit line 111 is precharged so that the sensing output line 114 is "L", the P-channel MOSFET 301 becomes conductive. As the bit line 111 is lowered in voltage level, a reference current flows from the P-channel MOSFETs 103, 301 to the current mirror circuit 145. Accordingly, a drain current is induced at an N-channel MOSFET 105 and serves as an output current. By this output current, the bit line 111 is further electrically discharged. When the sensing output line 114 becomes "H", the P-channel MOSFET 301 is turned off. Accordingly, a direct current path which existed between the P-channel MOSFET 103 and the current mirror circuit 145, does not exist any more, so that no direct current flows in the sensing circuit unit.

In an example of the sensing circuit unit shown in FIG. 3 (b), the P-channel MOSFET 302 is arranged such that the gate thereof is connected to the sensing output line 114, the source thereof is connected to the sources of N-channel MOSFETs 104, 105 forming the current mirror circuit 145 and the drain thereof is grounded.

In the sensing circuit unit having the arrangement above-mentioned, when a bit line 111 is precharged so that the sensing output line 114 is "L", the P-channel MOSFET 302 becomes conductive. Likewise in the example in FIG. 3 (a), as the bit line 111 is lowered in voltage level, an output current flows in the current mirror circuit 145, and the bit line 111 is electrically discharged. When the sensing output line 114 becomes "H", the P-channel MOSFET 302 is turned off. Accordingly, a direct current path which existed between the P-channel MOSFET 103 and the current mirror circuit 145, does not exist any more, so that no direct current flows in the sensing circuit unit.

According to each of the examples of the second embodiment, after the voltage level of the sensing output line 114 has been determined, each of the P-channel MOSFETs 301, 302 is turned off. Accordingly, an electric current from the P-channel MOSFET 103 serving as the electric current supply means to the current mirror circuit 145 is intercepted, thus reducing a direct current flowing in the sensing circuit unit. Accordingly, a sensing circuit unit in which sensing time is shortened and in which a power consumption is low is achieved.

Figure 4A:
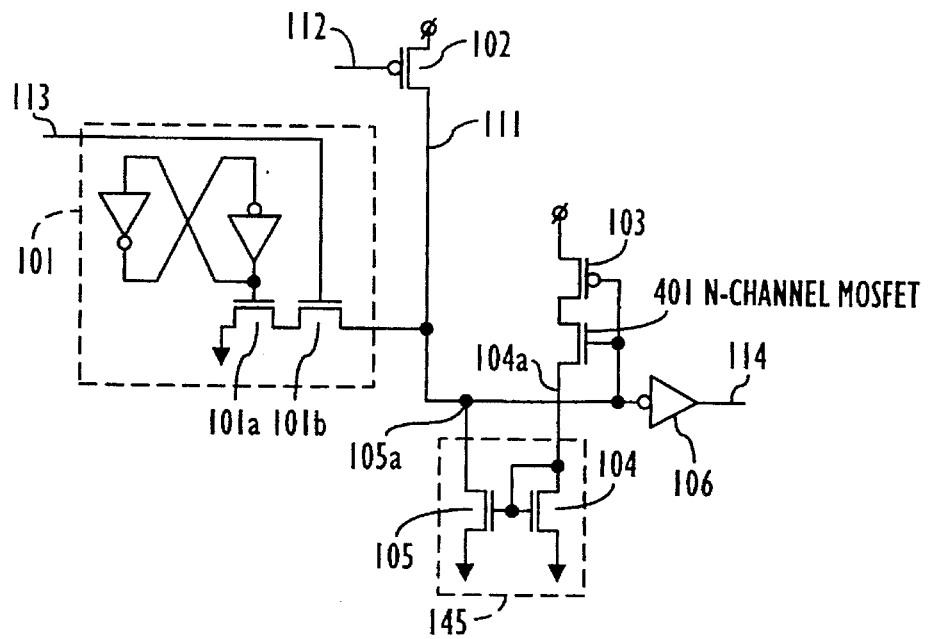
FIGS. 4(a) and (b) show circuit diagrams similar to FIG. 3, but illustrating a third embodiment of the present invention.
Figure 4B:
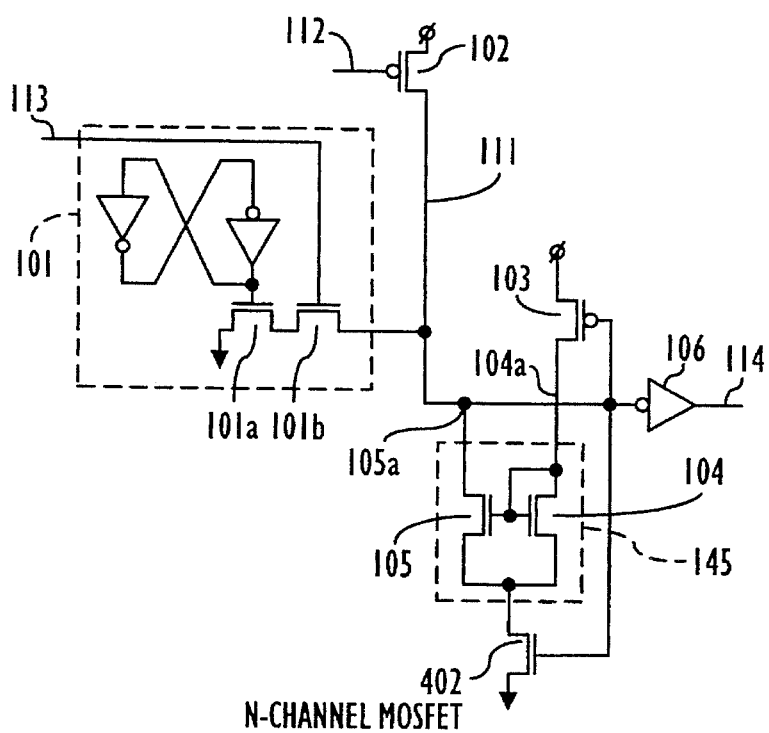

FIGS. 4(a) and 4(b) show circuit diagrams of the arrangements of main portions of examples of a sensing circuit unit for a dynamic circuit according to a third embodiment of the present invention. In FIG. 4, like parts are designated by like reference numerals used in FIG. 1.

In FIG. 4 (a) and (b), each of N-channel MOSFETs 401, 402 serves as supplied electric current control means for controlling, based on the voltage level of a bit line 111, the amount of an electric current supplied from a P-channel MOSFET 103 serving as electric current supply means, to a current mirror circuit 145.

In an example of the sensing circuit unit shown in FIG. 4 (a), the N-channel MOSFET 401 is arranged such that the gate thereof is connected to the bit line 111, the drain thereof is connected to the drain of the P-channel MOSFET 103 and the source thereof is connected to a reference current input line 104a.

In the sensing circuit unit having the arrangement above-mentioned, when the bit line 111 is precharged and becomes "H", the N-channel MOSFET 401 becomes conductive. As the bit line 111 is lowered in voltage level, a reference current flows from the P-channel MOSFET 103 and an N-channel MOSFET 104 to the current mirror circuit 145. Accordingly, an output current is induced at an N-channel MOSFET 105. By this output current, the bit line 111 is further electrically discharged. When the bit line 111 becomes "L", the N-channel MOSFET 401 is turned off. Accordingly, a direct current path which existed between the P-channel MOSFET 103 and the current mirror circuit 145, does not exist any more, so that no direct current flows in the sensing circuit unit.

In an example of the sensing circuit unit shown in FIG. 4 (b), the N-channel MOSFET 402 is arranged such that the gate thereof is connected to the bit line 111, the drain thereof is connected to the source s of N-channel MOSFETs 104, 105 forming the current mirror circuit 145 and the source thereof is grounded.

In the sensing circuit unit having the arrangement above-mentioned, when the bit line 111 is precharged and becomes "H", the N-channel MOSFET 402 becomes conductive. Likewise in the example in FIG. 4 (a), as the bit line 111 is lowered in voltage level, an output current-flows in the current mirror circuit 45 and the bit line 111 is electrically discharged. When the bit line 111 becomes "L" by such an electric discharge, the N-channel MOSFET 402 is turned off. Accordingly, a direct current path which existed between the P-channel MOSFET 103 and the current mirror circuit 145, does not exist any more, so that no direct current flows in the sensing circuit unit.

According to each of the examples of the third embodiment, after the voltage level of the bit line 111 has been determined, each of the N-channel MOSFETs 401, 402 is turned off. Accordingly, an electric current from the P-channel MOSFET 103 serving as the electric current supply means to the current mirror circuit 145 is intercepted, thus reducing direct current flowing in the sensing circuit unit. Accordingly, a sensing circuit unit in which sensing time is shortened and in which a power consumption is low is achieved.

Figure 5:
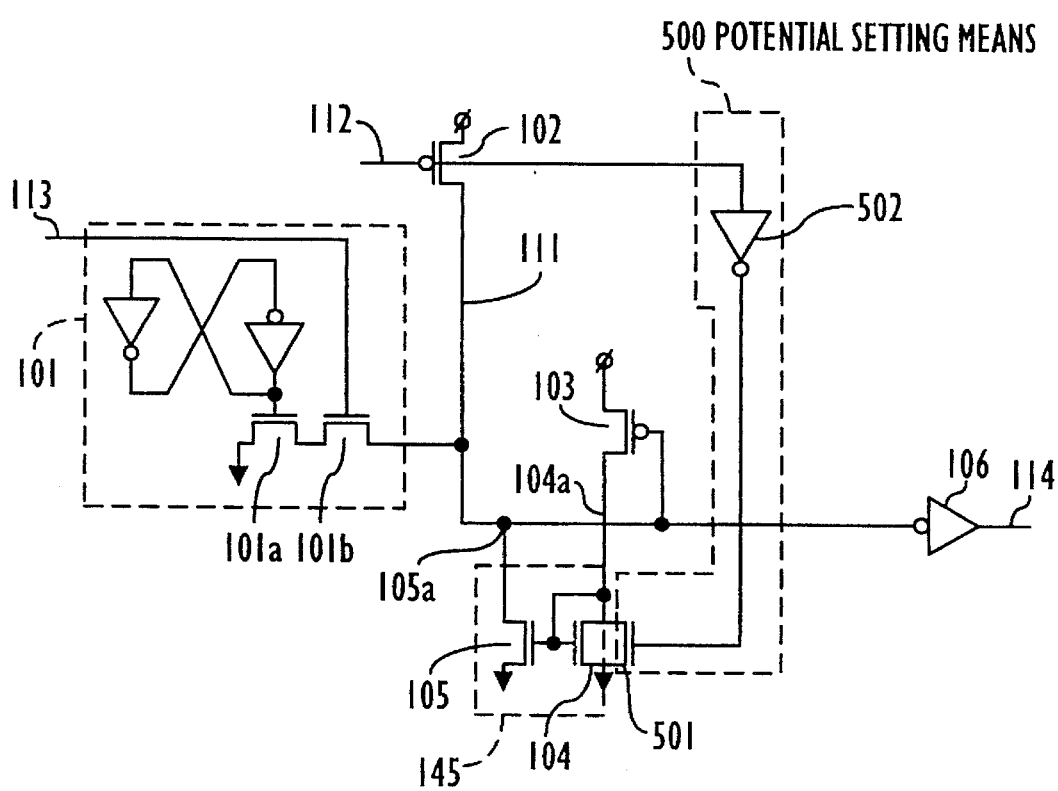
FIG. 5 is a circuit diagram similar to FIG. 3, but illustrating a fourth embodiment of the present invention.

FIG. 5 shows a circuit diagram of the arrangement of main portions of a sensing circuit unit for a dynamic circuit according to a fourth embodiment of the present invention. In FIG. 5, like parts are designated by like reference numerals used in FIG. 1.

In FIG. 5, a voltage level (potential) setting means 500 comprises; (i) an N-channel MOSFET 501 for setting the voltage level of a reference current input line 104a of a current mirror circuit 145, i.e., a control line of data line discharging means for stopping the electric discharge of the data line, to the voltage level of a ground line serving as a second preset voltage level of the control line during a precharging period of time of a bit line 111, and (ii) an inverter circuit 502 for generating a signal having a logic inverse to that of a precharge signal entered to a precharge enable line 112 of a precharge circuit 102.

The sensing circuit unit having the arrangement above-mentioned can overcome the following defects.

The reference current input line 104a presents a voltage level as divided by channel resistance of a P-channel MOSFET 103 and an N-channel MOSFET 104. Accordingly, when the gate width of the N-channel MOSFET 104 is made small, the gate voltage level of an N-channel MOSFET 105 becomes high. Further, when the gate width of the N-channel MOSFET 105 is made large, the output current, i.e., a drain current of the N-channel MOSFET 105, is large. Accordingly, the sensing time can be shortened. However, even though the electric discharge of the bit line 111 is complete, the gate voltage level of the N-channel MOSFET 105 continues to exceed the threshold voltage, and the N-channel MOSFET 105 is held as turned on such that the voltage level of the bit line 111 is liable to be fixed to "L". Accordingly, when the gate width of the N-channel MOSFET 104 is made too small, the driving ability of the N-channel MOSFET 105 becomes large such that the voltage level of the bit line 111 is not returned to "H" at the precharge time. Further, since there is formed a direct current path between the precharge circuit 102 and the N-channel MOSFET 105, precharging the bit line 111 disadvantageously takes a long time.

To avoid the defects above-mentioned, the N-channel MOSFET 501 is turned on when the bit line 111 is precharged. Accordingly, the voltage level of the reference current input line 104a, i.e., the gate voltage levels of the N-channel MOSFETs 104, 105, is lowered to the voltage level of the ground line. As a result, the N-channel MOSFET 105 is turned off and the current mirror circuit 145 is electrically disconnected from the bit line 111. Therefore, even though the gate width of the N-channel MOSFET 104 is made small, the voltage level of the bit line 111 can be stabilized and the precharging time of the bit line 111 can be shortened.

According to the fourth embodiment, when the bit line 111 is precharged, the voltage level setting means 500 sets the voltage level of the reference current input line 104a of the current mirror circuit 145 to the voltage level of the ground line. Accordingly, the current mirror circuit 145 can be electrically disconnected from the bit line 111 when the bit line 111 is precharged. This facilitates the optimization of circuit constants for shortening the sensing time. Further, the voltage level of the bit line 111 can be stabilized and the precharging time of the bit line 111 can be shortened.

The voltage level setting means 500 shown in the fourth embodiment may also be used in each of the sensing circuit units shown in FIGS. 1, 3 and 4 to produce similar effects.

Figure 6A:
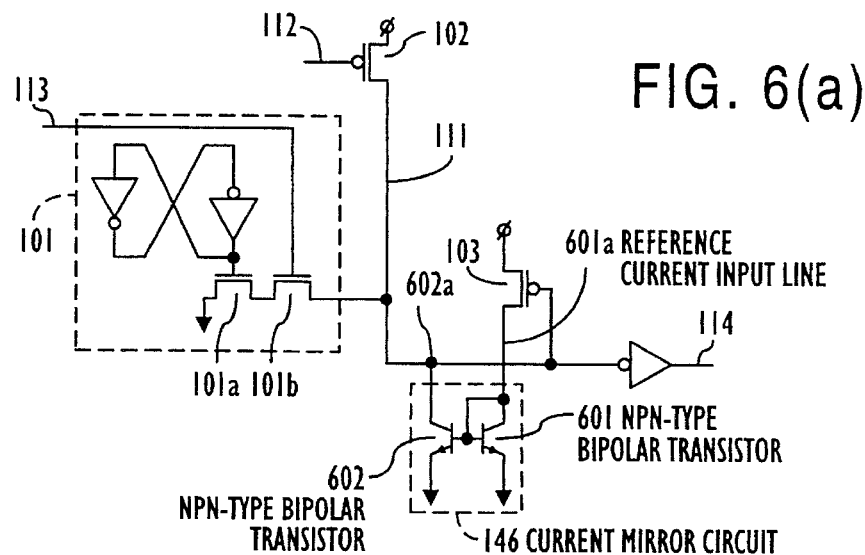
FIGS. 6(a), (b), and (c) show circuit diagrams similar to FIG. 3, but illustrating a fifth embodiment of the present invention.
Figure 6B:
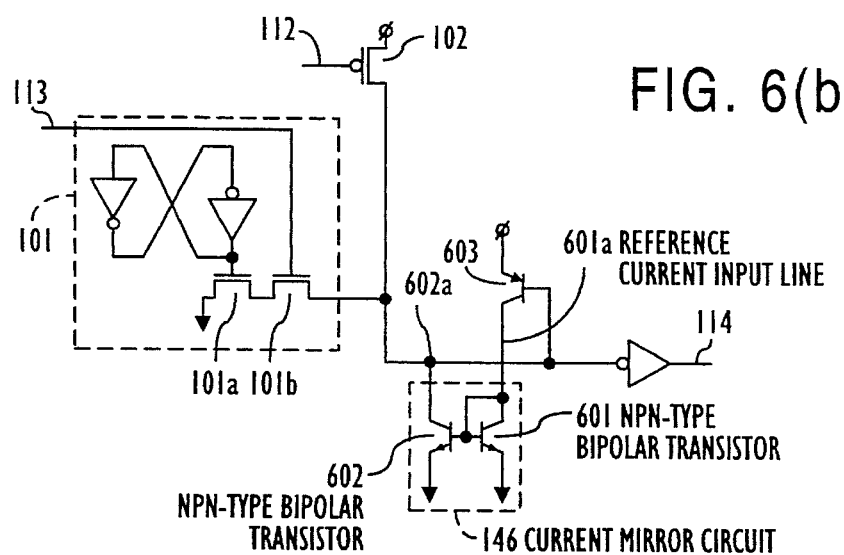
Figure 6C:
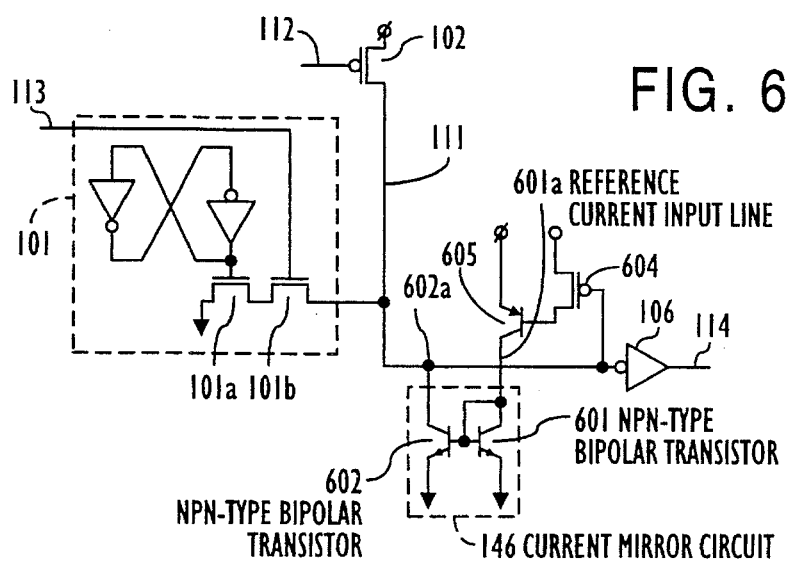

FIG. 6 shows circuit diagrams of the arrangements of main portions of examples of a sensing circuit unit for a dynamic circuit according to a fifth embodiment of the present invention. FIG. 6 (a) shows an example in which electric current supply means is formed by a P-channel MOSFET 103. FIG. 6 (b) shows an example in which electric current supply means is formed by a PNP-type bipolar transistor 603. FIG. 6 (c) shows an example in which the electric current supply means is formed by a P-channel MOSFET 604 and an NPN-type bipolar transistor 605. Each of the electric current supply means is adapted to detect a drop in the voltage level of a bit line 111 to supply an electric current to a current mirror circuit 146. In FIG. 6, like parts are designated by like reference numerals used in FIG. 1.

According to the fifth embodiment, the current mirror circuit 146 is formed by two NPN-type bipolar transistors 601, 602 as shown in FIG. 6.

The bipolar transistors 601, 602 have high transconductances and high current driving abilities. Accordingly, the bipolar transistors 601, 602 can detect the presence or absence of an electric current from each electric current supply means formed by (i) the P-channel MOSFET 103, (ii) the PNP-type bipolar transistor 603 or (iii) the P-channel MOSFET 604 and the NPN-type bipolar transistor 605, so that the bit line 111 can be electrically discharged at a high speed.

Such a sensing circuit unit can also be applied to a high-speed sensing circuit unit for a BiCMOS circuit, an ECL circuit, an ECL-CMOS circuit or the like.

Figure 7:
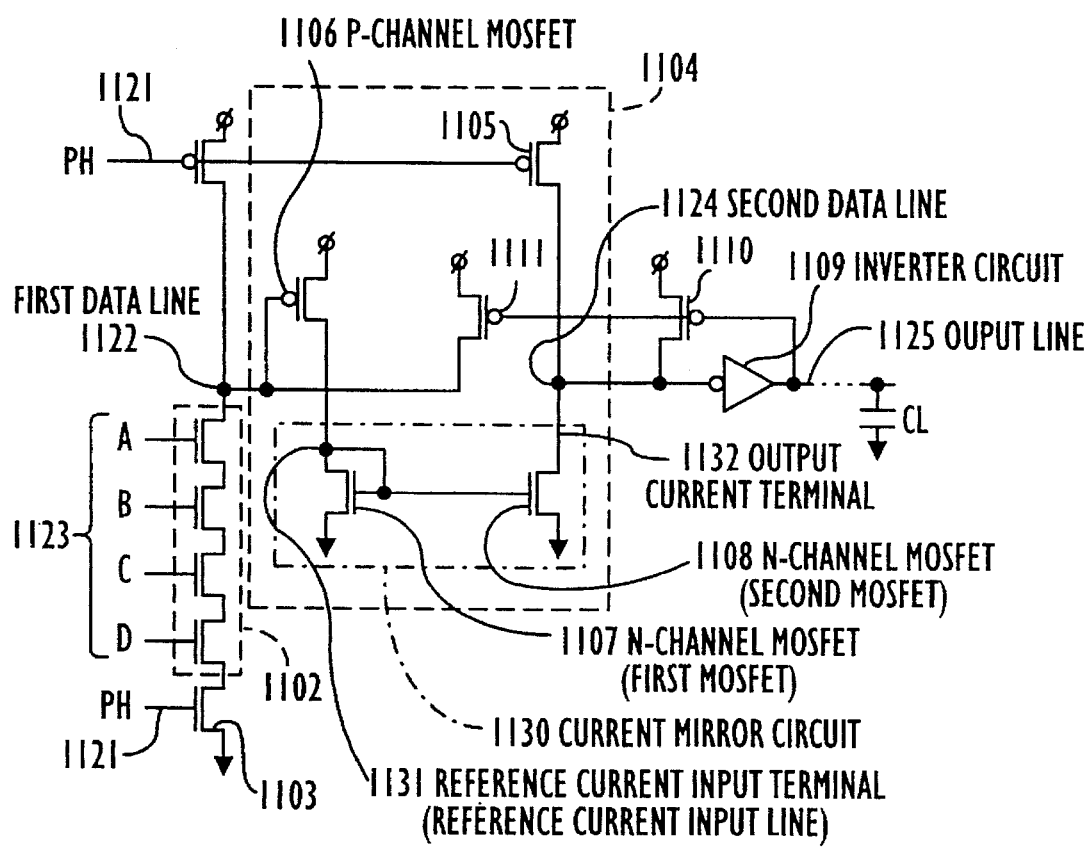
FIG. 7 shows a circuit diagram similar to FIG. 3, but illustrating a sixth embodiment of the present invention.

FIG. 7 shows a circuit diagram of the arrangement of main portions of a sensing circuit unit for a dynamic circuit according to a sixth embodiment of the present invention, in which the dynamic circuit is used as a large-scale circuit such as a register file, a RAM, a ROM, a PLA or the like which is required to be operated at a high speed. The sensing circuit unit for such a dynamic circuit has a data line to be precharged to a predetermined voltage level, and is arranged such that whether an evaluating circuit between the data line and a ground line is turned on or off, determines whether or not the data line is electrically discharged, and that based on such a determination, it is judged whether an evaluation logic is true or false. FIG. 7 shows a sensing circuit unit for a decoder circuit to be used in a RAM, a ROM, a PLA, a register file or the like.

In FIG. 7, a precharge circuit 1101 comprises a P-channel MOSFET. When the voltage level of a precharge enable line 1121 is "L", the sequence falls into a precharging period of time where the voltage level of a first data line 1122 is precharged to "H". A NAND-type evaluating circuit 1102 comprises MOSFETs which are connected in series to one another. When the voltage level of the precharge enable line 1121 becomes "H" and the sequence falls into an evaluating period of time, an electric current pass is formed in the evaluating circuit 1102 in the case all input signals A, B, C, D are true; that is, in the case all the voltage levels of input lines 1123 are "H".

A main component element 1104 of the high-speed sensing circuit unit for a dynamic circuit, comprises the following members. A precharge circuit 1105 comprises a P-channel MOSFET and is adapted to precharge a second data line 1124 to "H" when the voltage level of the precharge enable line 1121 is "H". A P-channel MOSFET 1106 serves as electric current supply means. When the voltage level Vdl of the first data line 1122 connected to the gate of the P-channel MOSFET 1106 is not larger than (VDD–Vtp) wherein VDD is the voltage level of a power supply and Vtp is a threshold voltage of the P-channel MOSFET 1106, a drain current flows in the P-channel MOSFET 1106 to detect the voltage level of the first data line 1122.

N-channel MOSFETs 1107, 1108 form a current mirror circuit 1130 serving as data line discharging means. The gate and drain of the N-channel MOSFET 1107 serve as a reference current input terminal 1131, which is connected to the drain of the P-channel MOSFET 1106. The source of the N-channel MOSFET 1107 is connected to a ground line. The drain of the N-channel MOSFET 1108 serves as an output current terminal 1132, which is connected to the second data line 1124. The gate of the N-channel MOSFET 1108 is connected to the reference current input terminal 1131 and the source of the N-channel MOSFET 1108 is connected to the ground line.

An inverter circuit 1109 is disposed for inverting the logic of the voltage level of the second data line 1124, and has an output line 1125. P-channel MOSFETs 1110, 1111 are respectively arranged such that, when the first and second data lines become "H", the first and second data lines are held as "H".

Figure 8:
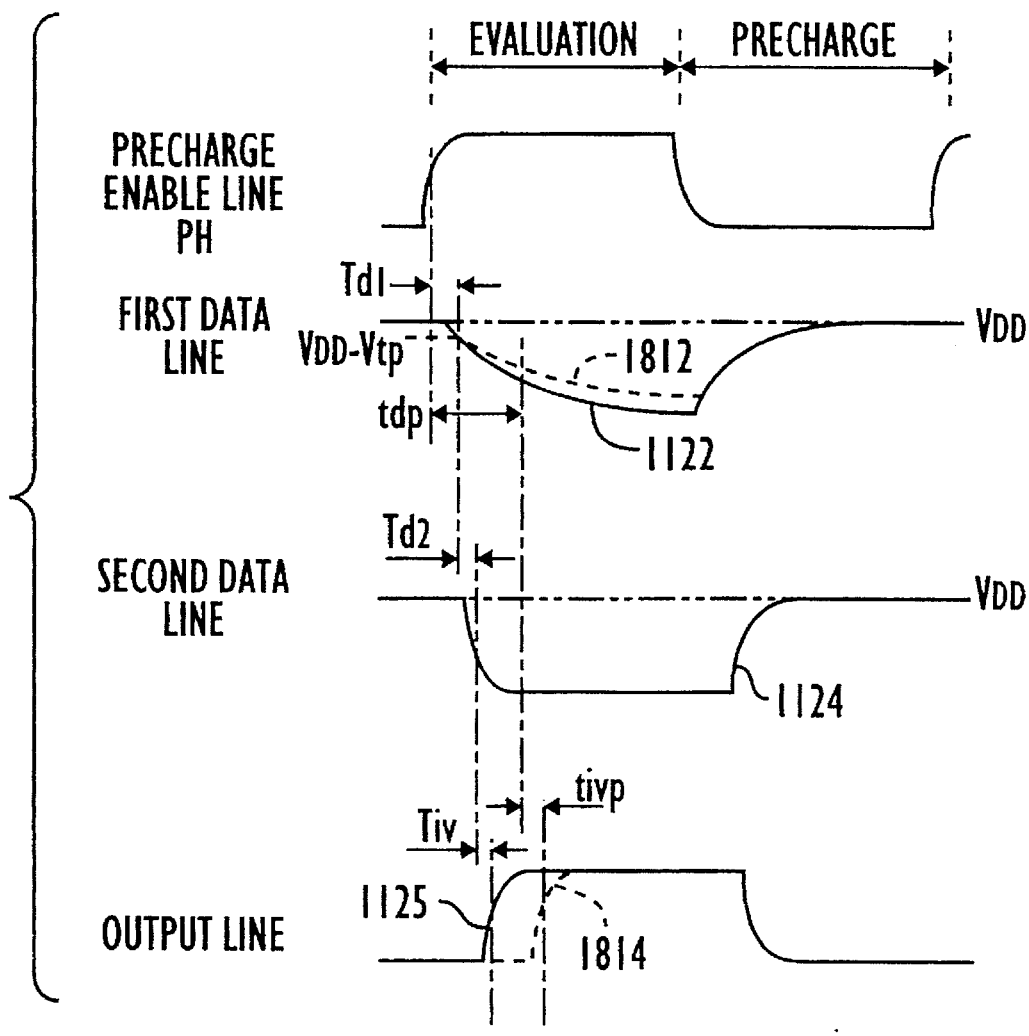
FIG. 8 shows a timing chart illustrating the operation of the sensing circuit unit according to the sixth embodiment of the present invention.

The operation of the sensing circuit unit for a dynamic circuit in FIG. 7 will be discussed with reference to FIG. 8 showing a diagram of operational timing. In FIG. 8, the voltage level waveforms of respective signal lines in the sensing circuit unit shown in FIG. 7 are designated by the same reference numerals used for designating the respective signal lines. For comparison, the voltage level waveforms of signal lines in a conventional sensing circuit unit shown in FIG. 15 (a) are also shown by broken lines.

The sensing circuit unit for a dynamic circuit according to the sixth embodiment, will be operated in an evaluating period of time as follows.

1) Evaluation Starting Period of Time

The period of time that the voltage level Vdl of the first data line is not larger than VDD and is not smaller than (VDD–Vtp), refers to an evaluation starting period of time of the evaluating circuit 102. In this period of time, the sensing circuit unit will be operated as set forth below.

When the precharge enable line 1121 is changed in state to "H" as shown in FIG. 8, the voltage level of the first data line 1122 is determined based on the result of logic judgment of the evaluating circuit 1102. When the judgment logic of the evaluating circuit 1102 is true, an electric current path is formed in the evaluating circuit 1102 and the voltage level of the first data line 1122 starts dropping to "L". Td1 refers to a delay time between the time when the precharge enable line 1121 becomes "H" and the time when the voltage level Vdl of the first data line 1122 is changed to (VDD–Vtp).

When the judgment logic of the evaluating circuit 1102 is false, no electric current pass is formed in the evaluating circuit 1102. Accordingly, the voltage level of the first data line 1122 remains unchanged as the precharged voltage level.

2) Current Mirror Circuit Operating Period of Time

When the voltage level Vdl of the first data line is not larger than (VDD–Vtp) and is not smaller than VSS which is the voltage level of the ground line, the sensing circuit unit will be operated as follows.

When the voltage level Vdl of the first data line 1122 becomes equal to and smaller than (VDD–Vtp), the P-channel MOSFET 1106 is turned on and a drain current flows in the P-channel MOSFET 1106. This drain current serves as a reference current to be entered into the reference current input terminal 1131 of the current mirror circuit 1130, i.e., the drain of the N-channel MOSFET 1107. An output current induced by this reference current flows to the output current terminal 1132, i.e., the drain of the N-channel MOSFET 1108. Since the output current terminal 1132 is connected to the second data line 1124, the second data line 1124 is electrically discharged at a high speed by the single N-channel MOSFET 1108. Further, since the first data line 1122 and the gate of the inverter circuit 1109 can be separated from each other, the load capacitance of the first data line 1122 is reduced. Accordingly, the evaluating circuit 1102 can be electrically discharged at a high speed. After the passage of a delay time Td2 from the time when the first data line 1122 exceeds a threshold voltage of the P-channel MOSFET 1106, the voltage level of the second data line 1124 exceeds a logical threshold value of the inverter circuit 1109. Further after the passage of a delay time Tiv of the inverter circuit 1109, the voltage level of the output line 1125 is determined. Since the sensing circuit unit is operated in the manner above-mentioned, an output delay time Tsn of the dynamic circuit is equal to the total time of the delay times Td1, Td2 and Tiv. Thus, the output delay time Tsn can be shortened.

Figure 15:
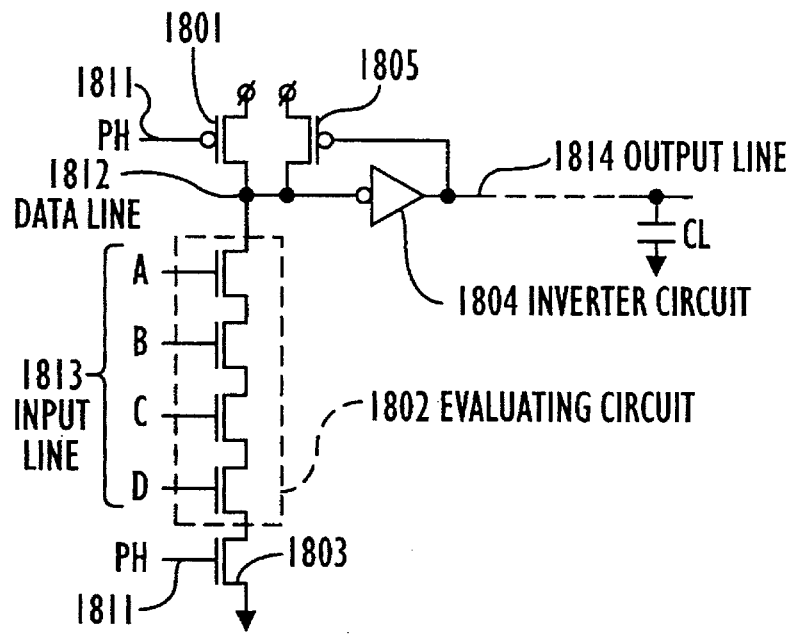
FIGS. 15(a) and (b) show a circuit diagram of a conventional sensing circuit unit for a dynamic circuit.
Figure 15:
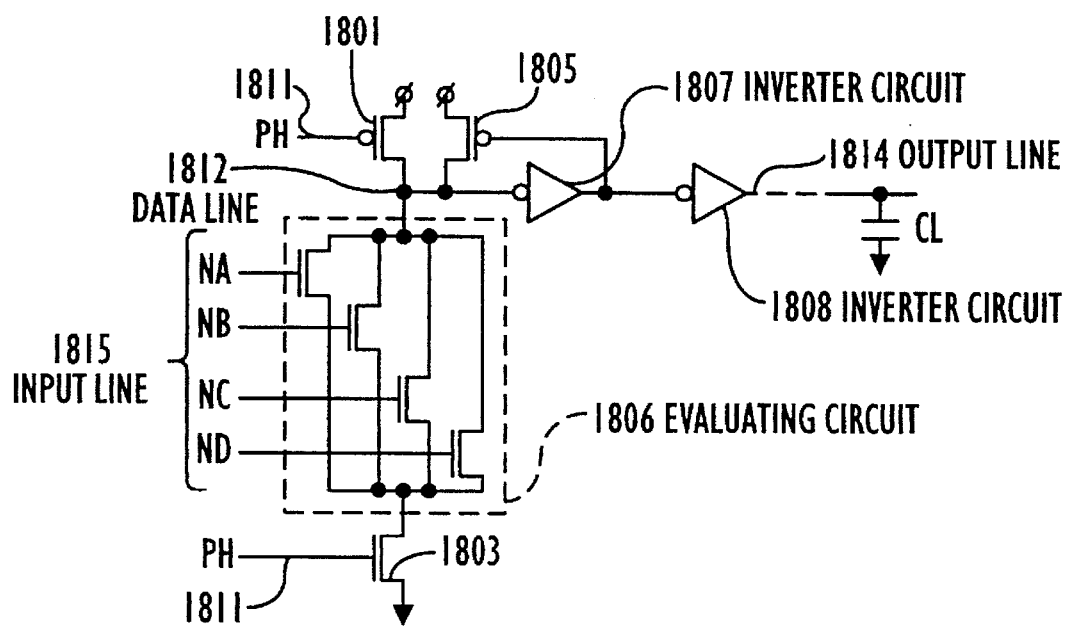

The following will discuss the operation of a conventional sensing circuit unit for a dynamic circuit with reference to FIG. 15 in which the dynamic circuit is shown in the form of a decoder circuit used in a RAM, a ROM, a PLA, a register file or the like.

FIG. 15 (a) shows a sensing circuit unit for a decoder circuit using a NAND-type dynamic circuit. FIG. 15 (a) shows a precharge circuit 1801 comprising a P-channel MOSFET, an evaluating circuit 1802 comprising series MOSFETs, input lines 1813 of logic signals A, B, C, D, a discharge circuit 1803 comprising an N-channel MOSFET, an inverter circuit 1804, an output line 1814, and a P-channel MOSFET 1805 for latching the voltage level of a data line 1812.

In the sensing circuit unit for a dynamic circuit having the arrangement above-mentioned, when the voltage level of a precharge enable line PH 1811 becomes "L", the sequence falls into a precharging period of time. Thus, the data line 1812 is precharged so that the voltage level thereof becomes "H", and the output line 1814 becomes "L". When the precharge enable line PH 1811 becomes "H", the sequence falls into the evaluating period of time. Thus, according to the logics of the input signals A, B, C, D, i.e., according to the voltage levels of the signal input lines 1813, it is determined whether or not an electric current pass is formed in the evaluating circuit 1802. When the voltage levels of the input signal lines 1813 are "H", i.e., when all the logics of the input signals A, B, C, D are true, the evaluation logic of the evaluating circuit 1802 becomes true, so that an electric current path is formed in the evaluating circuit 1802. The data line 1812 is electrically discharged and consequently becomes "L", and the output line 1814 becomes "H". On the other hand, if any of the logics of the input signals A, B, C, D is false and any of the signal input lines 1813 is "L", the evaluation logic becomes false. Accordingly, no electric current path is formed in the evaluating circuit 1802. Thus, the data line 1812 is not electrically discharged and the output line 1814 remains "L". In the sensing circuit unit for a NAND-type dynamic circuit in FIG. 15 (a), since the data line is electrically discharged by the series MOSFETs, the time taken for logic judgment is disadvantageously large. Further, when a dynamic circuit is used as a component element of a large-scale circuit such as a microprocessor, there are instances where a large load capacitance is connected to the output line 1814. In such a case, to improve the driving ability of the output inverter circuit 1804, the size of the MOSFET of the inverter circuit 1804 must be increased. However, when the MOSFET size is increased, the load capacitance of the NAND circuit is accordingly increased. Thus, the delay time before the voltage level of the output line is determined, is further increased.

In the conventional sensing circuit unit for a dynamic circuit shown in FIG. 15 (a), the data line 1812 is electrically discharged by the series MOSFETs forming the evaluating circuit 1802 and the inverter circuit 1804. Accordingly, the discharging time is large as shown by a broken line 1812 in FIG. 8. After the passage of a delay time tdp (which is larger than the total time of the delay times Td1 and Td2) from the time when the precharge enable line 1811 becomes "H", the voltage level of the data line 1812 is changed to the logic threshold voltage of the inverter circuit 1804. After the passage of a delay time tivp of the inverter circuit 1804, the voltage level of the output line 1814 is determined. An output delay time tsp of the dynamic circuit is equal to the total time of the delay time tdp and the delay time tivp, and is larger than Tsn.

FIG. 15 (b) shows a conventional sensing circuit unit for a NOR-type dynamic circuit in order to compare the present invention therewith. FIG. 15 (b), shows an evaluating circuit 1806 comprising parallel MOSFETs, and output inverter circuits 1807, 1808 for supplying an evaluation result in a positive logic.

The evaluating circuit 1806 is connected to signal lines 1815 of signals NA, NB, NC, ND respectively having logics inverse to those of input signals A, B, C, D. In a precharging period of time, a data line 1812 is "H", or an output line 1814 is "H". When all the logics of the signals NA, NB, NC, ND are true, i.e., when all the input signal lines 1815 are "L", the evaluation logic of the evaluating circuit 1806 becomes true. Accordingly, no electric current path is formed in the evaluating circuit 1806 so that the data line 1812 is not electrically discharged and remains "H", and the output line 1814 also remains "H". When the logic of any of the signals NA, NB, NC, ND is false, i.e., when any of the input lines 1815 is "H", the evaluation logic of the evaluating circuit 1806 becomes false and an electric current path is formed in the evaluating circuit 1806. Accordingly, the data line 1812 is electrically discharged and becomes "L", and the output line 1814 also becomes "L". In the conventional sensing circuit unit for a NOR-type dynamic circuit in FIG. 15 (b), the number of series stages of MOSFETs forming discharge passes of the data line is small, and a plurality of discharge passes are present. Accordingly, the sensing operation is carried out at a high speed, but the power consumption is disadvantageously large. In the sensing circuit unit for a NOR-type dynamic circuit, when the evaluation logic becomes false, the data line is electrically discharged and becomes "L". When a plurality of NOR-type dynamic circuits are used in a decoder circuit unit of a RAM, a ROM, a PLA or a register file, the evaluation logic in only one of the dynamic circuits becomes true and the evaluation logics in all other dynamic circuits are false. Accordingly, the data lines of most of the dynamic circuits are repeatedly electrically discharged and precharged at each cycle, thus increasing the power consumption.

Consideration is now made of the case where the sensing circuit unit for a dynamic circuit of the sixth embodiment of the present invention in FIG. 7 is used in a plural number for decoder circuits of RAMs, ROMs or the like. In this case, since each of data lines connected to output inverter circuits is electrically discharged by a single MOSFET, the sensing operation is carried out at a high speed likewise in the sensing circuit unit for a NOR-type dynamic circuit. On the other hand, the power consumption can be remarkably reduced as compared with the sensing circuit unit for a NOR-type dynamic circuit. More specifically, when logic circuits are formed by NAND-type circuits as in the sixth embodiment, only one of a plurality of evaluation logics becomes true, and it is only one dynamic circuit in which the data line is repeatedly electrically discharged and precharged. In NOR-type dynamic circuits, as mentioned earlier in connection with the prior art, data lines are repeatedly electrically discharged and precharged in most of the NOR-type dynamic circuits, so that the power consumption is considerably increased. Accordingly, the sensing circuit unit for a dynamic circuit according to the present invention has both features, i.e., a low power consumption which is the feature in a sensing circuit unit for a NAND-type dynamic circuit, and a high-speed operation which is the feature in a sensing circuit unit for a NOR-type dynamic circuit.

According to this sixth embodiment, the first data line 1122 connected to the evaluating circuit 1102 is separated from the second data line 1124 connected to the inverter circuit 1109, so that the load capacitance of the evaluating circuit 1102 can be reduced. Unlike in the conventional sensing circuit unit where a data line is electrically discharged by series MOSFETs, the second data line is electrically discharged by the single MOSFET forming the current mirror circuit. Thus, the delay time of the dynamic circuit can be shortened. Accordingly, the sixth embodiment has both features, i.e., a low power consumption which is the feature in a sensing circuit unit for a NAND-type dynamic circuit and a high-speed electric discharge which is the feature in a sensing circuit unit for a NOR-type dynamic circuit, thus achieving a sensing circuit unit for a dynamic circuit which is operated at a high speed with a low power consumption.

In the sixth embodiment, the N-channel MOSFETs 1107, 1108 are used for forming the current mirror circuit 1130, but P-channel MOSFETs may also be used to produce similar effects.

FIGS. 9(a) and 9(b) show circuit diagrams of the arrangements of main portions of examples of a sensing circuit unit for a dynamic circuit according to a seventh embodiment of the present invention. FIGS. 9(a) and 9(b) show the sensing circuit unit for a decoder circuit serving as a dynamic circuit, which is operated at a high speed with a low power consumption. In FIGS. 9(a) and 9(b) like parts are designated by like reference numerals used in FIG. 7.

Figure 9:
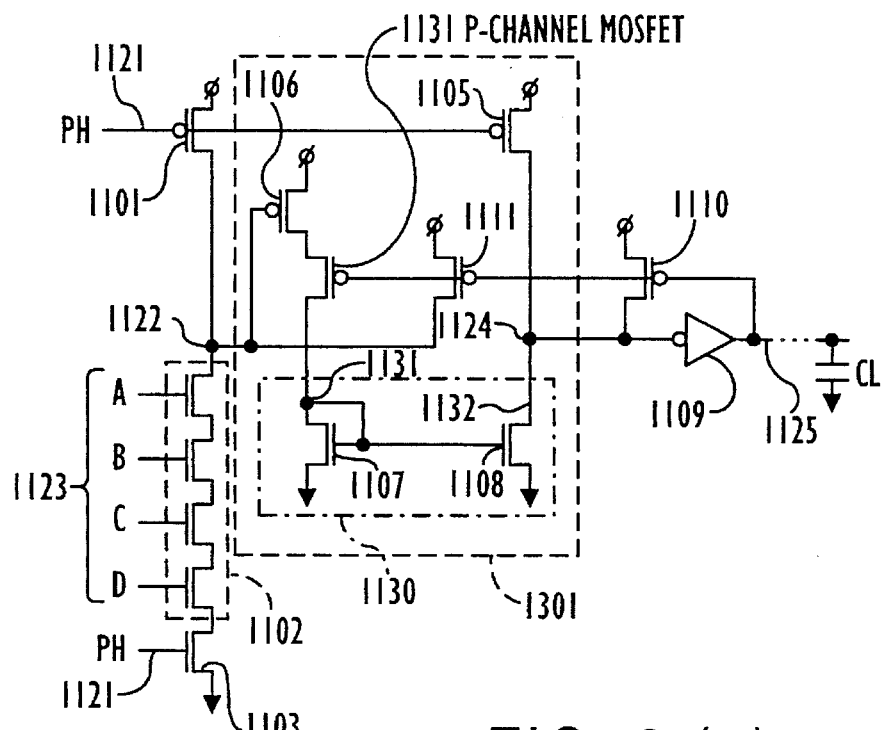
FIGS. 9(a) and (b) show circuit diagrams similar to FIG. 3, but illustrating a seventh embodiment of the present invention.
Figure 9:
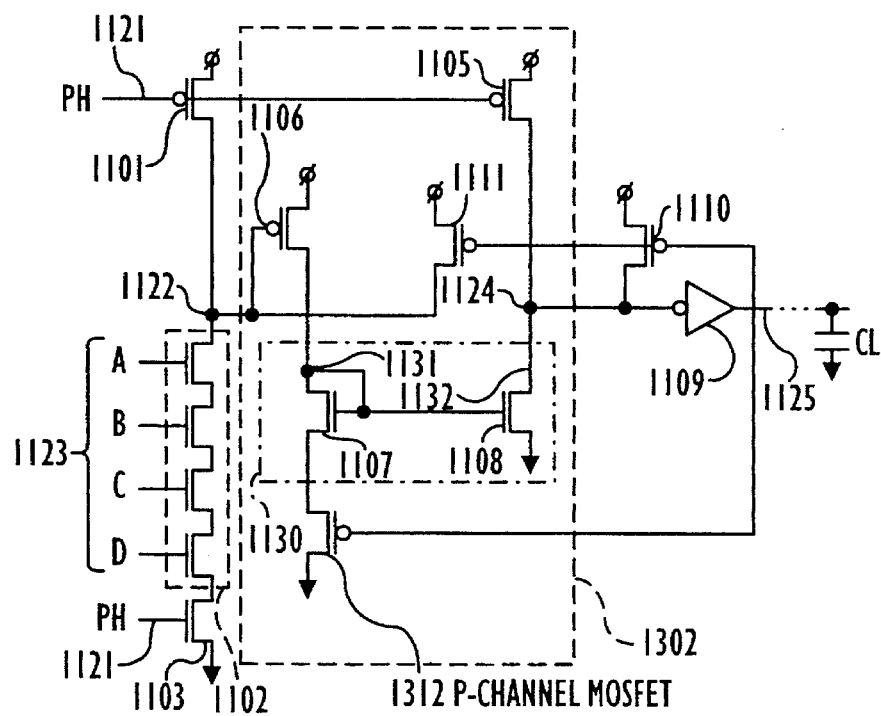

In FIG. 9 (a) and (b), main component elements 1301, 1302 are used for achieving sensing circuit units for dynamic circuits, which are operated at a high speed with a low power consumption. Each of P-channel MOSFETs 1311, 1312 is disposed for controlling, according to the voltage level of an output line 1125 of an inverter circuit 1109, the amount of an electric current flowing from a P-channel MOSFET 1106 serving as electric current supply means to a current mirror circuit 1130.

In the example of the sensing circuit unit for a dynamic circuit in FIG. 9 (a), the P-channel MOSFET 1311 is arranged such that the gate thereof is connected to the output line 1125, the source thereof is connected to the drain of the P-channel MOSFET 1106 and the drain thereof is connected to a reference current input line 1131 of the current mirror circuit 1130.

In the sensing circuit unit for a dynamic circuit having the above-mentioned arrangement, when a second data line 1124 is precharged so that the output line 1125 is "L", the P-channel MOSFET 1311 becomes conductive. As a first data line 1122 is lowered in voltage level, an electric current flows from the P-channel MOSFETs 1106, 1311 to the reference current input line 1131 of the current mirror circuit 1130. Accordingly, a drain current of an N-channel MOSFET 1108 is induced at an output current terminal 1132 and serves as an output current. By this output current, the second data line 1124 is electrically discharged. When the output line 1125 becomes "H", the P-channel MOSFET 1311 is turned off. Accordingly, a direct current path which existed between the P-channel MOSFET 1106 and an N-channel MOSFET 1107, does not exist any more so that no direct current flows in the current mirror circuit 1130.

In the example of the sensing circuit unit for a dynamic circuit shown in FIG. 9 (b), the P-channel MOSFET 1312 is arranged such that the gate thereof is connected to the output line 1125, the source thereof is connected to the source of an N-channel MOSFET 1107 forming the current mirror circuit, and the drain thereof is connected to a ground line.

In the sensing circuit unit for a dynamic circuit having the arrangement above-mentioned, when a second data line 1124 is precharged so that the output line 1125 is "L", the P-channel MOSFET 1312 becomes conductive. As a first data line 1122 is lowered in voltage level, a reference current flows from the P-channel MOSFET 1106 to the current mirror circuit 1130. By an output current, i.e., a drain current of an N-channel MOSFET 1108 which is then induced, the second data line 1124 is electrically discharged. When the output line 1125 becomes "H", the P-channel MOSFET 1312 is turned off. Accordingly, a direct current path which existed between the P-channel MOSFET 1106 serving as electric current supply means and the N-channel MOSFET 1107 of the current mirror circuit 1130, does not exist any more so that no direct current flows in the current mirror circuit 1130.

According to each of the examples of the seventh embodiment, after the voltage level of the output line 1125 has been determined, each of the P-channel MOSFETs 1311, 1312 is turned off. Accordingly, the path supplying an electric current from the P-channel MOSFET 1106 serving as electric current supply means to the N-channel MOSFET 1107 is intercepted. By reducing a direct current flowing in the current mirror circuit 1130, a sensing circuit, unit for a dynamic circuit, which is operated at a high speed with a low power consumption is achieved.

FIGS. 10(a) and 10(b) show circuit diagrams of the arrangements of main portions of examples of a sensing circuit unit for a dynamic circuit according to an eighth embodiment of the present invention. FIGS. 10(a) and 10(b) show examples of the sensing circuit unit for a decoder circuit serving as a dynamic circuit, which is operated at a high speed with a low power consumption. FIGS. 10(a) and 10(b), like parts are designated by like reference numerals used in FIG. 7.

Figure 10:
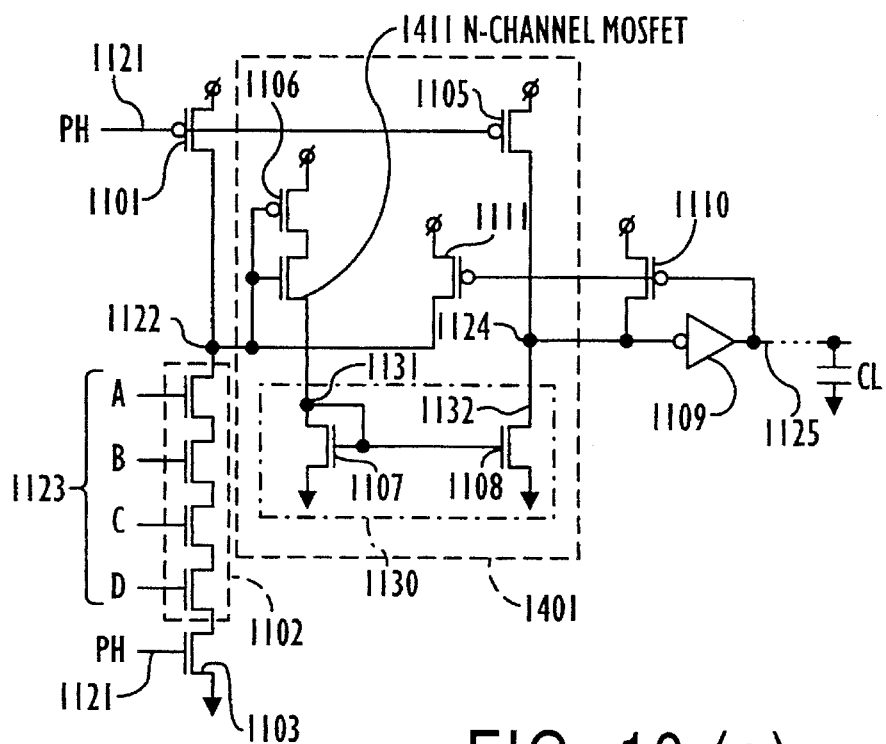
FIGS. 10(a) and (b) show circuit diagrams similar to FIG. 3, but illustrating an eighth embodiment of the present invention.
Figure 10:
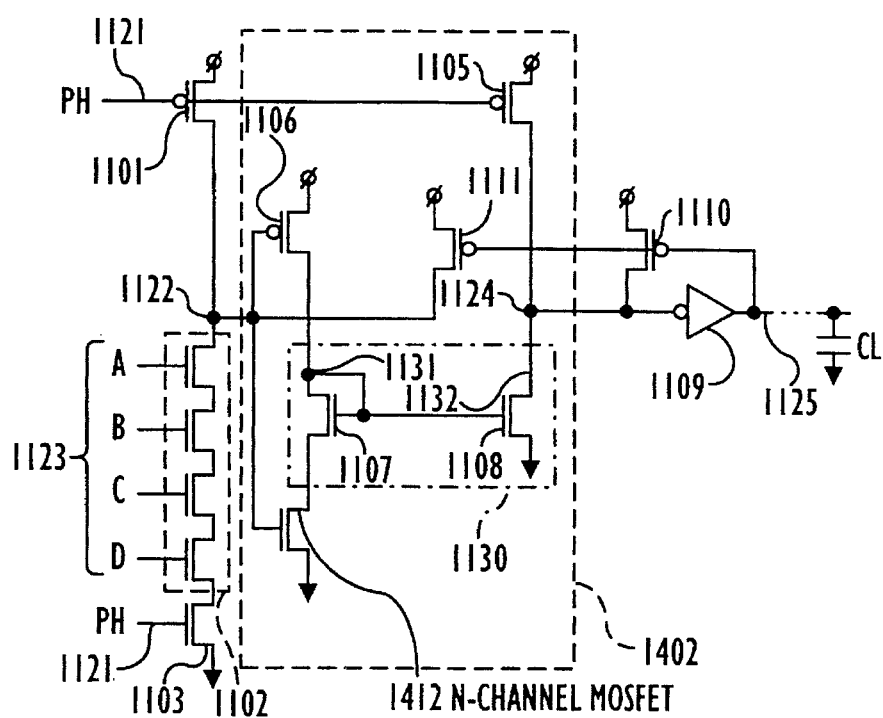

In FIG. 10 (a) and (b), main component elements 1401, 1402 are used for achieving sensing circuit units for dynamic circuits, which are operated at a high speed with a low power consumption. Each of N-channel MOSFETs 1411, 1412 is disposed for controlling, according to the voltage level of a first data line 1122, the amount of an electric current flowing from a P-channel MOSFET 1106 serving as electric current supply means to a current mirror circuit 1130.

In the example of the sensing circuit unit for dynamic circuit in FIG. 10 (a), the N-channel MOSFET 1411 is arranged such that the gate thereof is connected to a first data line 1122, the drain thereof is connected to the drain of the P-channel MOSFET 1106 and the source thereof is connected to a reference current input line of the current mirror circuit 1130.

In the sensing circuit unit for a dynamic circuit having the above-mentioned arrangement, when the first data line 1122 is precharged and therefore becomes "H", the N-channel MOSFET 1411 becomes conductive. As the first data line 1122 is lowered in voltage level, a reference current flows from the P-channel MOSFET 1106 and the N-channel MOSFET 1411 to the current mirror circuit 1130. By an output current, i.e., a drain current of an N-channel MOSFET 1108 which is then induced, a second data line 1124 is electrically discharged. When the first data line 1122 becomes "L", the N-channel MOSFET 1411 is turned off. Accordingly, a direct current path which existed between the P-channel MOSFET 1106 serving as electric current supply means and an N-channel MOSFET 1107, does not exist any more so that no direct current flows in the current mirror circuit 1130.

In the example of the sensing circuit unit for a dynamic circuit in FIG. 10 (b), the N-channel MOSFET 1412 is arranged such that the gate thereof is connected to a first data line 1122, the drain thereof is connected to the source of an N-channel MOSFET 1107 of the current mirror circuit 1130, and the source thereof is connected to a ground line.

In the sensing circuit unit for a dynamic circuit above-mentioned, when the first data line 1122 is precharged and therefore becomes "H", the N-channel MOSFET 1412 becomes conductive. As the first data line 1122 is lowered in voltage level, a reference current flows from the P-channel MOSFET 1106 to the current mirror circuit 1130. By an output current, i.e., a drain current of an N-channel MOSFET 1108 which is then induced, a second data line 1124 is electrically discharged. When the first data line 1122 becomes "L", the N-channel MOSFET 1412 is turned off. Accordingly, a direct current path which existed between the P-channel MOSFET 1106 serving as electric current supply means and the N-channel MOSFET 1107, does not exist any more, so that no direct current flows in the current mirror circuit 1130.

According to each of the examples of the eighth embodiment, after the voltage level of the first data line 1122 has been determined, each of the N-channel MOSFETs 1411, 1412 is turned off. Accordingly, the path supplying an electric current from the P-channel MOSFET 1106 serving as electric current supply means to the N-channel MOSFET 1107 is intercepted. By reducing a direct current flowing in the current mirror circuit 1130 serving as data line discharging means, there is achieved a sensing circuit unit which is operated at a high speed with a low power consumption.

FIGS. 11(a) and 11(b) show circuit diagrams of the arrangements of main portions of examples of a sensing circuit unit for a dynamic circuit according to a ninth embodiment of the present invention. FIGS. 11(a) and 11(b) show examples of the sensing circuit unit for a decoder circuit unit serving as a dynamic circuit, which is operated at a high speed with a low power consumption. In FIGS. 11(a) and 11(b) like parts are designated by like reference numerals used in FIG. 7.

Figure 11:
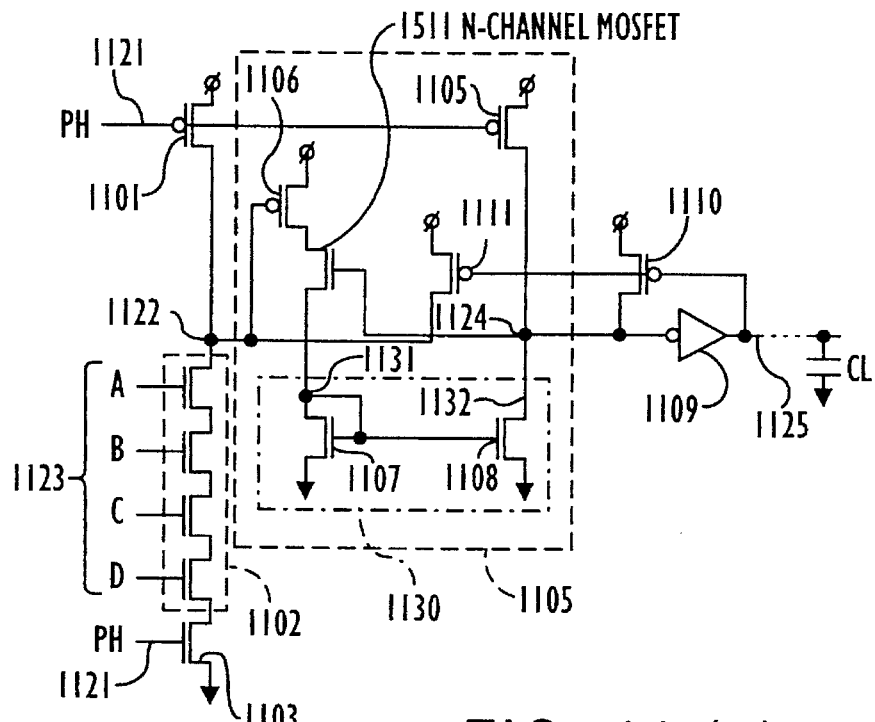
FIGS. 11(a) and (b) show circuit diagrams similar to FIG. 3, but illustrating a ninth embodiment of the present invention.
Figure 11:
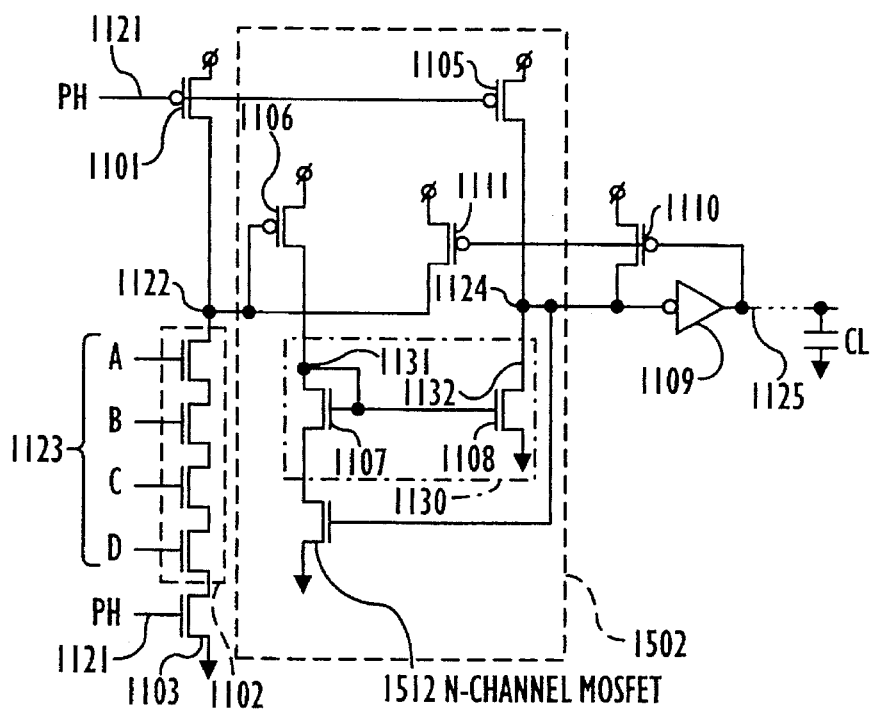

In FIG. 11 (a) and (b), main component elements 1501, 1502 are used for achieving sensing circuit units for dynamic circuits which are operated at a high speed with a low power consumption. Each of N-channel MOSFETs 1511, 1512 is disposed for controlling, according to the voltage level of a second data line 1124, the amount of an electric current flowing from a P-channel MOSFET 1106 serving as electric current supply means to a current mirror circuit 1130.

In the example of the sensing circuit unit for a dynamic circuit in FIG. 11 (a), the N-channel MOSFET 1511 is arranged such that the gate thereof is connected to a second data line 1124, the drain thereof is connected to the drain of the P-channel MOSFET 1106 and the source thereof is connected to a reference current input terminal 1131 of the current mirror circuit 1130.

In the sensing circuit unit for a dynamic circuit having the arrangement above-mentioned, when the second data line 1124 is precharged and therefore becomes "H", the N-channel MOSFET 1511 becomes conductive. As a first data line 1122 is lowered in voltage level, a reference current flows from the P-channel MOSFET 1106 and the N-channel MOSFET 1511 to the current mirror circuit 1130. By an output current, i.e., a drain current of an N-channel MOSFET 1108 which is then induced, the second data line 1124 is electrically discharged. When the second data line 1124 becomes "L", the N-channel MOSFET 1511 is turned off. Accordingly, a direct current path which has existed between the P-channel MOSFET 1106 serving as electric current supply means and an N-channel MOSFET 1107, does not exist any more, so that no direct current flows in the current mirror circuit 1130.

In the example of the sensing circuit unit for a dynamic circuit in FIG. 11 (b), the N-channel MOSFET 1512 is arranged such that the gate thereof is connected to a second data line 1124, the drain thereof is connected to the source of an N-channel MOSFET 1107 of the current mirror circuit 1130, and the source thereof is connected to a ground line.

In the sensing circuit unit for a dynamic circuit having the arrangement above-mentioned, when the second data line 1124 is precharged and therefore becomes "H", the N-channel MOSFET 1512 becomes conductive. As a first data line 1122 is lowered in voltage level, a reference current flows from the P-channel MOSFET 1106 to the current mirror circuit 1130. By an output current, i.e., a drain current of an N-channel MOSFET 1108 which is then induced, the second data line 1124 is electrically discharged. When the second data line 1124 becomes "L", the N-channel MOSFET 1512 is turned off. Accordingly, a direct current path which existed between the P-channel MOSFET 1106 serving as electric current supply means and the N-channel MOSFET 1107, does not exist any more, so that no direct current flows in the current mirror circuit 1130.

According to each of the examples of the ninth embodiment, after the voltage level of the second data line 1124 has been determined, each of the N-channel MOSFETs 1511, 1512 is turned off. Accordingly, the path supplying an electric current from the P-channel MOSFET 1106 serving as electric current supply means to the N-channel MOSFET 1107 is intercepted. By reducing a direct current flowing in the current mirror circuit 1130, a sensing circuit unit which is operated at a high speed with a low power consumption is achieved.

Figure 12:
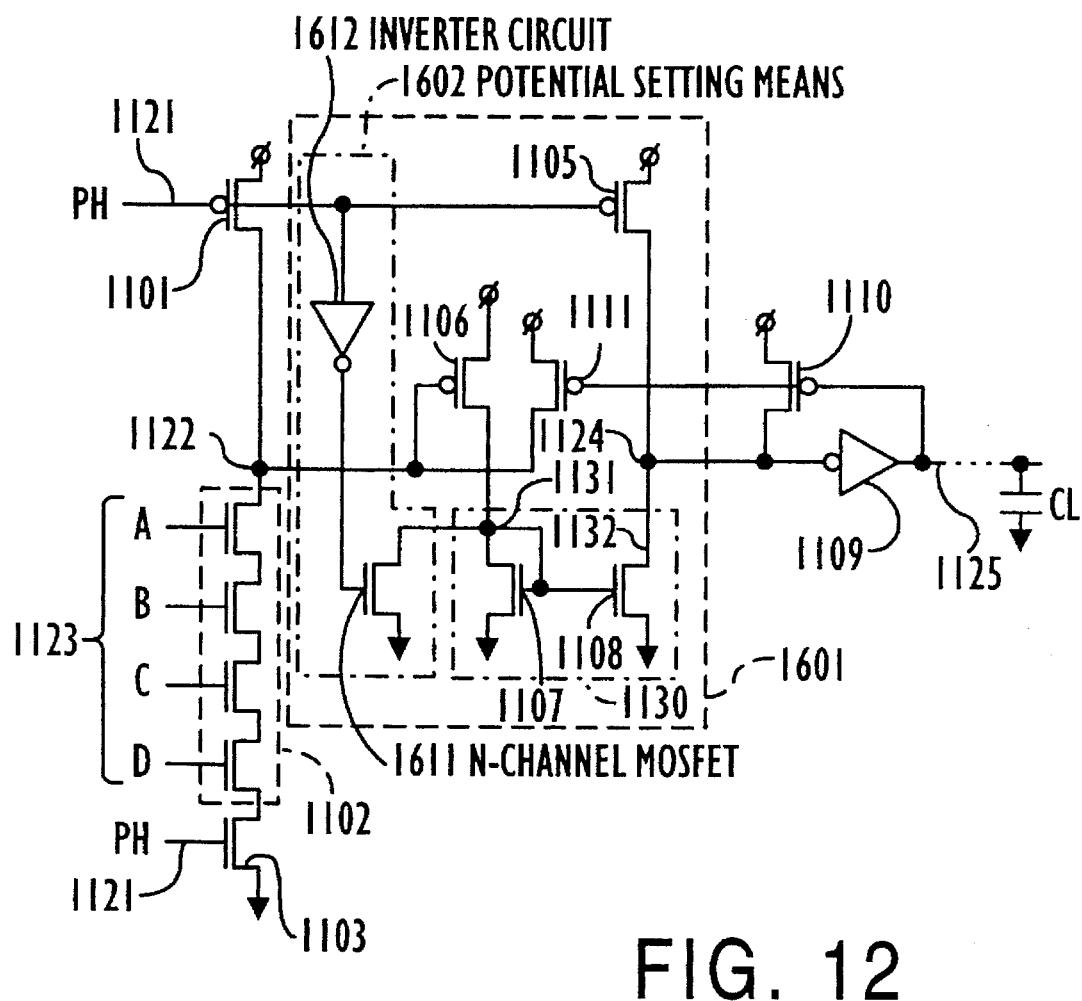
FIG. 12 shows a circuit diagram similar to FIG. 3, but illustrating a tenth embodiment of the present invention.

FIG. 12 shows a circuit diagram of the arrangement of main portions of a sensing circuit unit for a dynamic circuit according to a tenth embodiment of the present invention. FIG. 12 shows the sensing circuit unit for a decoder circuit serving as a dynamic circuit, which is operated at a high speed with a low power consumption. In FIG. 12, like parts are designated by like reference numerals used in FIG. 7.

In FIG. 12, a main component element 1601 is used for achieving a sensing circuit unit for a dynamic circuit which is operated at a high speed with a low power consumption. The voltage (potential) level setting means 1602 comprises: (i) an N-channel MOSFET 1611 for setting the voltage level of a reference current input terminal 1131 of a current mirror circuit 1130 to the voltage level of a ground line in a precharging period of time of a first data line 1122 and a second data line 1124, and ( ii ) an inverter circuit 1612 for generating a signal having a logic inverse to that of a precharge signal.

The sensing circuit unit having the above-mentioned arrangement can overcome the following defects.

The reference current input line 1131 presents a voltage level as divided by channel resistance of a P-channel MOSFET 1106 and an N-channel MOSFET 1107. Accordingly, when the gate width of the N-channel MOSFET 1107 is made small, the gate voltage level of an N-channel MOSFET 1108 becomes high. Further, when the gate width of the N-channel MOSFET 1108 is made large, a large output current is produced, i.e., a large drain current of the N-channel MOSFET 1108. Accordingly, the discharging time of the second data line 1124 can be shortened. However, even though the electric discharge of the second data line 1124 is complete, the gate voltage level of the N-channel MOSFET 1108 continues to exceed the threshold voltage and the N-channel MOSFET 1108 is held as turned on such that the voltage level of the second data line 1124 is liable to be fixed to "L". Accordingly, when the gate width of the N-channel MOSFET 1107 is made too small, the driving ability of the N-channel MOSFET 1108 becomes large such that the voltage level of the second data line 1124 is not returned to "H" at the precharge time. Further, since a direct current path is formed between the N-channel MOSFET 1108 and a P-channel MOSFET 1105 of a precharge circuit, precharging the second data line 1124 disadvantageously takes a long time.

To avoid the above-mentioned defects, the voltage level setting means 1602 is arranged such that, when precharging the first data line 1122 and the second data line 1124, the voltage level of the reference current input terminal 1131 of the current mirror circuit 1130, i.e., the gate voltage levels of the N-channel MOSFETs 1107, 1108, is lowered to the voltage level of the ground line. As a result, the N-channel MOSFET 1108 is turned off and the current mirror circuit 1130 is electrically disconnected from the second data line 1124. Therefore, even though the gate width of the N-channel MOSFET 1107 is made small, the voltage level of the second data line 1124 can be stabilized and the precharging time can be shortened.

According to the tenth embodiment, when the first data line 1122 and the second data line 1124 are precharged, the voltage level setting means 1602 causes the current mirror circuit 1130 to be electrically disconnected from the second data line 1124. This facilitates the optimization of circuit constants for shortening the delay time. Further, the voltage level of the second data line 1124 can be stabilized and the time for precharging the second data line 1124 can be shortened.

The voltage level setting means 1602 shown in the tenth embodiment may be used in each of the sensing circuit units shown in FIGS. 7, 9(a), 9(b), 10(a), 10(b), 11(a) and 11(b) and FIG. 13, to be discussed later, to produce similar effects.

Figure 13:
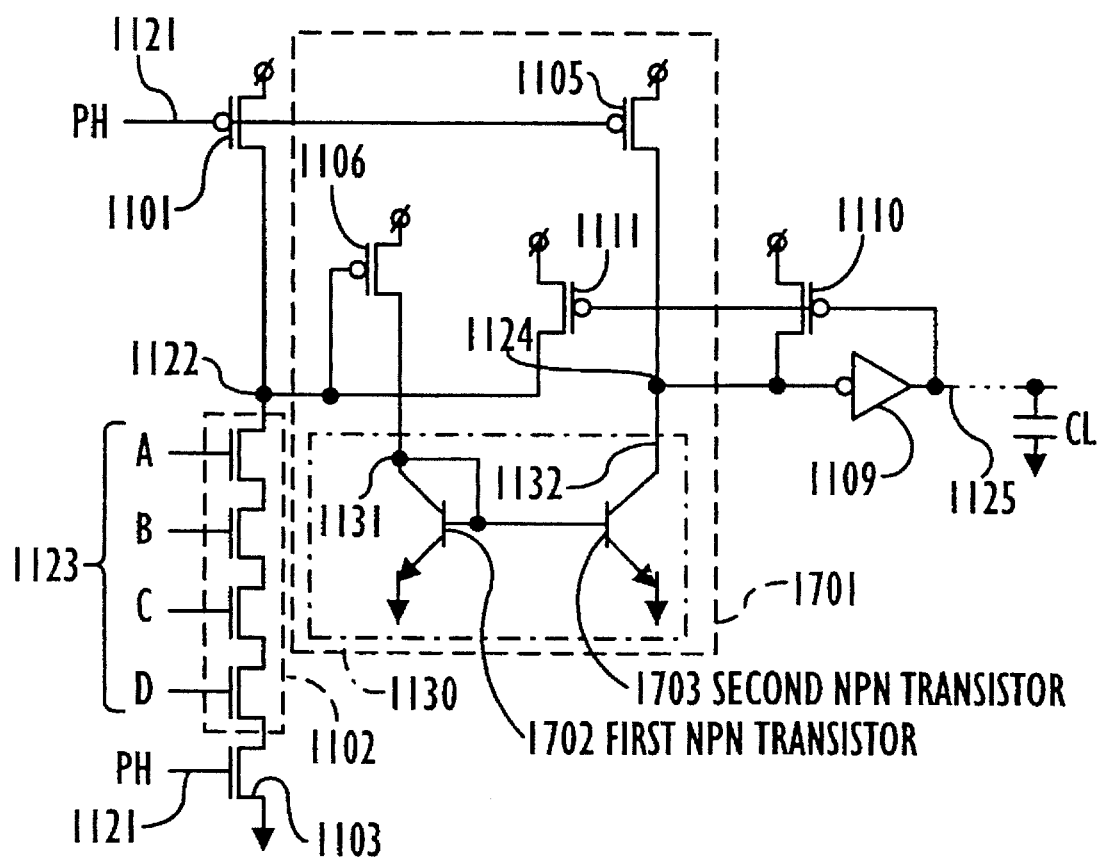
FIG. 13 shows a circuit diagram similar to FIG. 3, but illustrating an eleventh embodiment of the present invention.

FIG. 13 shows a circuit diagram of the arrangement of main portions of a sensing circuit unit for a dynamic circuit according to an eleventh embodiment of the present invention. In FIG. 13, there is shown the sensing circuit unit for a decoder circuit serving as a dynamic circuit, which is operated at a high speed with a low power consumption. In FIG. 13, like parts are designated by like reference numerals used in FIG. 7.

In FIG. 13, a main component element 1701 is used for achieving a sensing circuit unit for a dynamic circuit which is operated at a high speed with a low power consumption. A current mirror circuit 1130 is formed by two NPN transistors 1702, 1703.

The bipolar transistors 1702, 1703 have high transconductances and high current driving abilities. Accordingly, the bipolar transistors 1702, 1703 can detect the presence or absence of an electric current from a P-channel MOSFET 1106 serving as electric current supply means, so that a second data line 1124 can be electrically discharged at a high speed.

Such a sensing circuit unit for a dynamic circuit can also be applied to a BiCMOS circuit, an ECL circuit, an ECL-CMOS circuit or the like.

In each of the embodiments above-mentioned, there is used a logic circuit formed by NAND-type series MOSFETs, but similar effects may also be produced with the use of a logic circuit in which an optional logic function is defined.

What is claimed is:

1. A sensing circuit unit for a dynamic circuit for detecting voltage level variations of a data line which is disposed in the dynamic circuit and which is precharged to a predetermined voltage level, said sensing circuit unit comprising:

an electric current supply means for detecting voltage level variations of said data line, said electric current supply means connected to said data line for supplying an electric current when the voltage level of said data line varies;

a data line discharging means having as an input said electric current from said electric current supply means and having an output current terminal connected to said data line for electrically discharging said data line according to the presence or absence of an electric current supplied from said electric current supply means;

whereby the decal line discharging means is operated directly by the electric current of said electric current supply means, an inverter circuit having a gate input line connected to said data line; and a supplied electric current control means, connected to said data line discharging means and an output line of said inverter circuit, for cutting off said electric current supplied from the electric current supply means to the data lane discharging means when a change of the voltage level of an output line of said inverter circuit is determined.

2. A sensing circuit unit for a dynamic circuit according to claim 1, wherein the data line discharging means has a control line which disables the discharging of the data line when the voltage level of said control line is set to a second preset voltage level; said sensing circuit further comprising:

a voltage level setting means adapted such that, when the data line is precharged, the voltage level of said control line of said data discharging means is set to said second preset voltage level.

3. A sensing circuit unit for a dynamic circuit according to claim 1, wherein the data line discharging means is a current mirror circuit having (i) an input line to which an electric current from the electric current supply means is entered as a reference current, and (ii) an output current terminal connected to the data line.

4. A sensing circuit unit for a dynamic circuit for detecting voltage level variations of a first data line which is disposed in the dynamic circuit and which is precharged to a predetermined voltage level, said sensing circuit unit comprising:

a second data line to be precharged to a predetermined voltage level simultaneously with said first data line;

an electric current supply means, connected to said first data line, for supplying an electric current when the voltage level of said first data line varies; and a data line discharging means having as an input said electric current from said electric current supply means and having an output current terminal connected to said second data line for electrically discharging said second data line according to the presence or absence of an electric current supplied from said electric current supply means.

5. A sensing circuit unit for a dynamic circuit according to claim 4, further comprising:

an inverter circuit having a gate input line connected to the second data line; and a supplied electric current control means, connected to said data line discharging means and an output line of said inverter circuit, for cutting off said electric current supplied from the electric current supply means to the data line discharging means when a change of the voltage level of an output line of said inverter circuit is determined.

6. A sensing circuit unit for a dynamic circuit according to claim 4, further comprising a supplied electric current control means, connected to said first data line and said data line discharging means, for cutting off said electric current supplied from the electric current supply means to the data line discharging means when a change of the voltage level of said first data line is determined.

7. A sensing circuit unit for a dynamic circuit according to claim 4, further comprising a supplied electric current control means, connected to said second data line and said data line discharging means, for cutting off said electric current supplied from the electric current supply means to the data line discharging means when a change of the voltage level of said second data line is determined.

8. A sensing circuit unit for a dynamic circuit according to either of claims 1, 6, or 7, wherein the supplied electric current control means comprises an N-channel MOSFET.

9. A sensing circuit unit for a dynamic circuit according to claim 4, wherein the data line discharging means has a control line which disables discharging of the second data line when the voltage level of said control line is set to a second preset voltage level; said sensing circuit further comprising:

a voltage level setting means adapted such that, when the first data line is precharged, the voltage level of said control line of said data discharging means is set to said second predetermined voltage level and the voltage level of said input line of said data line discharging means is set to the voltage level of a ground line.

10. A sensing circuit unit for a dynamic circuit according to claim 4, wherein the data line discharging means is a current mirror circuit having (i) an input line to which an electric current from the electric current supply means is entered as a reference current, and (ii) an output current terminal connected to the second data line.

11. A sensing circuit unit for a dynamic circuit according to claim 10, wherein the current mirror circuit comprises: (i) a first MOSFET of which drain and gate are connected to the reference current input line and of which source is connected to a ground line, and (ii) a second MOSFET of which gate is connected to said reference current input line, of which drain is connected to the second data line and of which source is connected to said ground line.

12. A sensing circuit unit for a dynamic circuit according to claim 10, wherein the current mirror circuit comprises: (i) a first NPN-type transistor of which collector and base are connected to the reference current input line and of which emitter is connected to a ground line, and (ii) a second NPN-type transistor of which base is connected to said reference current input line, of which collector is connected to the second data line and of which emitter is connected to said ground line.

13. A sensing circuit unit for a dynamic circuit according to claim 4, wherein the electric current supply means comprises a P-channel MOSFET of which gate is connected to the first data line and of which source is connected to a power line, a drain electric current of said P-channel MOSFET serving as an electric current to be supplied from said electric current supply means.

14. A sensing circuit unit for a dynamic circuit for detecting voltage level variations of a data line which is disposed in the dynamic circuit and which is precharged to a predetermined voltage level, said sensing circuit unit comprising:

an electric current supply means, connected to said data line, for supplying an electric current when the voltage level of said data line varies;

a data line discharging means having as an input said electric current from said electric current supply means and having an output current terminal connected to said data line for electrically discharging said data line according to the presence or absence of an electric current supplied from said electric current supply means;

an inverter circuit having a gate input line connected to said data line; and a supplied electric current control means, connected between said electric current supply means and said data line discharging means, for cutting off said electric current supplied from said electric current supply means to said data line discharging means when a change of the voltage level of an output line of said inverter circuit is determined.

15. A sensing circuit unit for a dynamic circuit according to claim 14, wherein the electric current supply means comprises a P-channel MOSFET having its gate connected to the data line and its source connected to a power line, a drain electric current of said P-channel MOSFET serving as an electric current to be supplied from said electric current supply means.

16. A sensing circuit unit for a dynamic circuit according to claim 14, or claim 5 wherein the supplied electric current control means comprises a P-channel MOSFET.

17. A sensing circuit unit for a dynamic circuit for detecting voltage level variations of a data line which is disposed in the dynamic circuit and which is precharged to a predetermined voltage level, said sensing circuit unit comprising:

an electric current supply means connected to said data line for supplying an electric current when the voltage level of said data line varies;

a data line discharging means having as an input said electric current from said electric current supply means and having an output current terminal connected to said data line for electrically discharging said data line according to the presence or absence of an electric current supplied from said electric current supply means;

wherein the data line discharging means has a control line which disables the discharging of the data line when the voltage level of said control line is set to a second preset voltage level, and a voltage level setting means connected to said data line discharging means such that, when the data line is precharged, the voltage level of said control line of said data discharging means is set to said second preset voltage level.

18. A sensing circuit unit for a dynamic circuit for detecting voltage level variations of a data line which is disposed in the dynamic circuit and which is precharged to a predetermined voltage level, said sensing circuit unit comprising:

an electric current supply means connected to said data line for supplying an electric current when the voltage level of said data line varies; and a data line discharging means including a current mirror circuit having as an input said electric current from said electric current supply means as a reference current, and having an output current terminal connected to said data line for electrically discharging said data line according to the presence or absence of an electric current supplied from said electric current supply means.

19. A sensing circuit unit for a dynamic circuit according to claim 18, wherein the current mirror circuit comprises: (i)

a first MOSFET of which drain and gate are connected to the reference current input line and of which source is connected to a ground line, and (ii) a second MOSFET of which gate is connected to said reference current input line, of which drain is connected to the data line and of which source is connected to said ground line.

20. A sensing circuit unit for a dynamic circuit according to claim 19, wherein the first and second MOSFETs are N-channel MOSFETs.

21. A sensing circuit unit for a dynamic circuit according to claim 18, wherein the current mirror circuit comprises: (i) a first NPN-type transistor of which collector and base are connected to the reference current input line and of which emitter is connected to a ground line, and (ii) a second NPN-type transistor of which base is connected to said reference current input line, of which collector is connected to the data line and of which emitter is connected to said ground line.

* * * * *

UNITED STATES PATENT AND TRADEMARK OFFICE
CERTIFICATE OF CORRECTION

PATENT NO. :  5,559,456
DATED      :  September 24, 1996
INVENTOR(S) : Tsuguyasu Hatsuda It is certified that error appears in the above-indentified patent and that said Letters Patent is hereby corrected as shown below:

Col. 18, line 11,   delete "decal" and insert --data--.

Signed and Sealed this

Third Day of March, 1998

Attest:

BRUCE LEHMAN

Attesting Officer         Commissioner of Patents and Trademarks